United States Patent
Lill et al.

(10) Patent No.: US 11,792,987 B2
(45) Date of Patent: Oct. 17, 2023

(54) SELF-ALIGNED VERTICAL INTEGRATION OF THREE-TERMINAL MEMORY DEVICES

(71) Applicant: LAM RESEARCH CORPORATION, Fremont, CA (US)

(72) Inventors: Thorsten Lill, Santa Clara, CA (US); Meihua Shen, Fremont, CA (US); John Hoang, Fremont, CA (US); Hui-Jung Wu, Pleasanton, CA (US); Gereng Gunawan, Saratoga, CA (US); Yang Pan, Los Altos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 292 days.

(21) Appl. No.: 17/283,645

(22) PCT Filed: Oct. 22, 2019

(86) PCT No.: PCT/US2019/057418
§ 371 (c)(1),
(2) Date: Apr. 8, 2021

(87) PCT Pub. No.: WO2020/086566
PCT Pub. Date: Apr. 30, 2020

(65) Prior Publication Data
US 2021/0391355 A1    Dec. 16, 2021

Related U.S. Application Data

(60) Provisional application No. 62/775,615, filed on Dec. 5, 2018, provisional application No. 62/751,089, filed on Oct. 26, 2018.

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 43/10* (2023.02); *H10B 51/10* (2023.02); *H10B 51/20* (2023.02)

(58) Field of Classification Search
CPC ........ H10B 43/27; H10B 41/10; H10B 41/27; H10B 43/10; H10B 51/10; H10B 51/20;
(Continued)

(56) References Cited

U.S. PATENT DOCUMENTS 8,728,955 B2   5/2014   LaVoie et al.
8,778,797 B2   7/2014   Gao et al.
(Continued)

FOREIGN PATENT DOCUMENTS

TW        I584286 B        5/2017
WO    WO-2019036292 A1    2/2019
WO    WO-2019178030 A1    9/2019

OTHER PUBLICATIONS

International Search Report and Written Opinion of the ISA issued in PCT/US2019/057418, dated Feb. 11, 2020; ISA/KR.
(Continued)

*Primary Examiner* — Allison Bernstein

(57) ABSTRACT

A three-dimensional (3D) memory structure includes memory cells and a plurality of oxide layers and a plurality of word line layers. The plurality of oxide layers and the plurality of word line layers are alternately stacked in a first direction. A plurality of double channel holes extend through the plurality of oxide layers and the plurality of word line layers in the first direction. The plurality of double channel holes have a peanut-shaped cross-section in a second direction that is transverse to the first direction.

31 Claims, 23 Drawing Sheets

(51) Int. Cl.
*H10B 41/27* (2023.01)
*H10B 43/10* (2023.01)
*H10B 51/10* (2023.01)
*H10B 51/20* (2023.01)

(58) Field of Classification Search
CPC . H10B 12/00; H01L 29/7926; H01L 27/0688; H01L 29/66833; H01L 29/792
See application file for complete search history.

(56) References Cited

U.S. PATENT DOCUMENTS

| | | | |
|---|---|---|---|
| 9,082,826 B2 | 7/2015 | Chandrashekar et al. | |
| 9,401,371 B1* | 7/2016 | Lee | H10B 43/27 |
| 9,502,238 B2 | 11/2016 | Danek et al. | |
| 9,837,286 B2 | 12/2017 | Yang et al. | |
| 10,199,212 B2 | 2/2019 | Smith et al. | |
| 10,214,807 B2 | 2/2019 | Collins et al. | |
| 10,777,566 B2* | 9/2020 | Lue | G11C 5/025 |
| 11,133,329 B2* | 9/2021 | Lue | H10B 51/20 |
| 2012/0313066 A1 | 12/2012 | Park et al. | |
| 2013/0107602 A1 | 5/2013 | Oh et al. | |
| 2015/0340371 A1 | 11/2015 | Lue | |
| 2016/0099254 A1 | 4/2016 | Park et al. | |
| 2017/0110335 A1 | 4/2017 | Yang et al. | |
| 2017/0148805 A1 | 5/2017 | Nishikawa et al. | |
| 2017/0236731 A1 | 8/2017 | Caron et al. | |
| 2018/0040623 A1 | 2/2018 | Kanakamedala et al. | |
| 2018/0122822 A1 | 5/2018 | Lee et al. | |
| 2018/0174870 A1 | 6/2018 | Yang et al. | |
| 2019/0043876 A1 | 2/2019 | van Schravendijk et al. | |
| 2022/0384470 A1* | 12/2022 | Jiang | H10B 43/20 |

OTHER PUBLICATIONS

Taiwanese Office Action for Taiwan Application No. 108137820 dated Aug. 15, 2023.

* cited by examiner

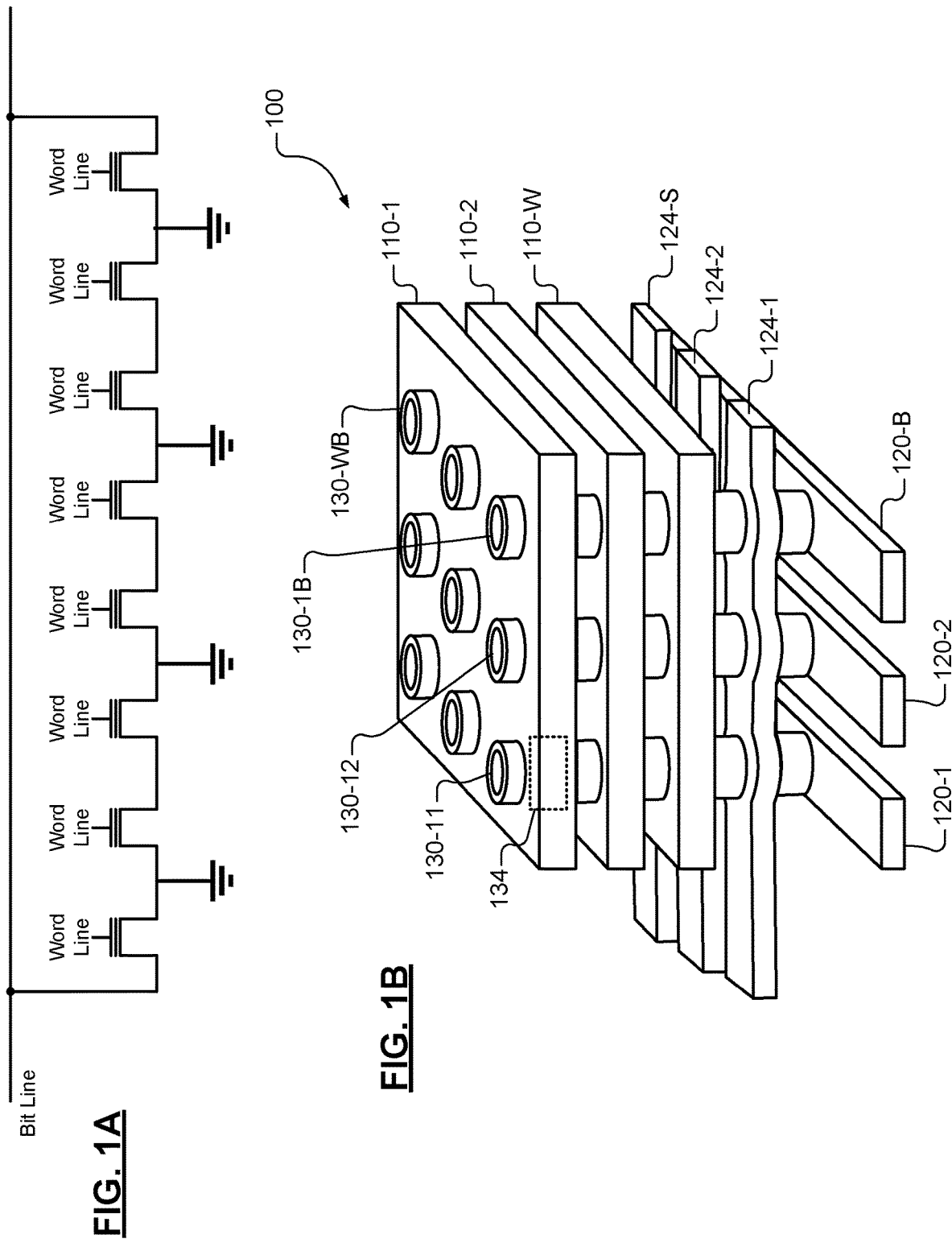

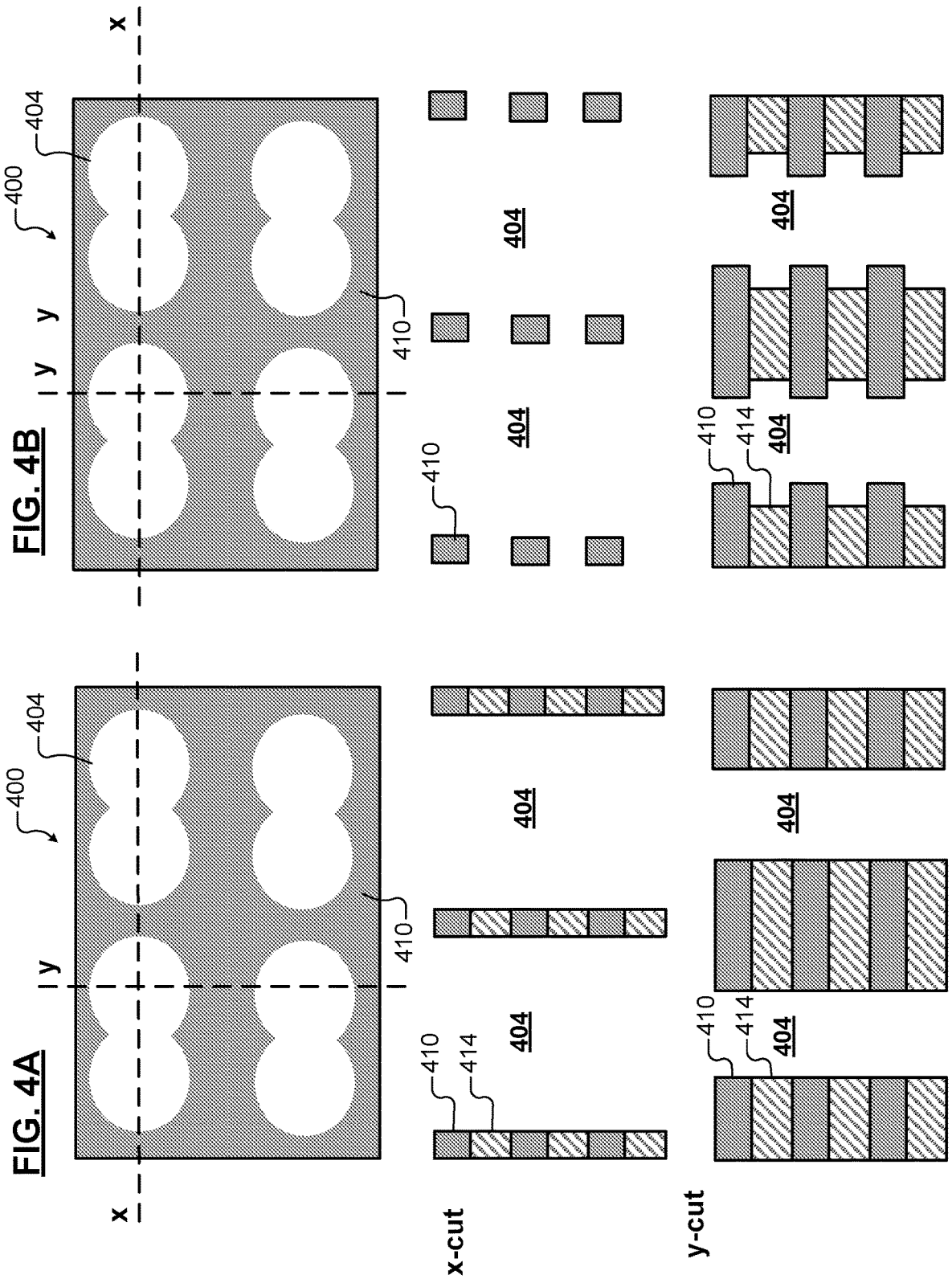

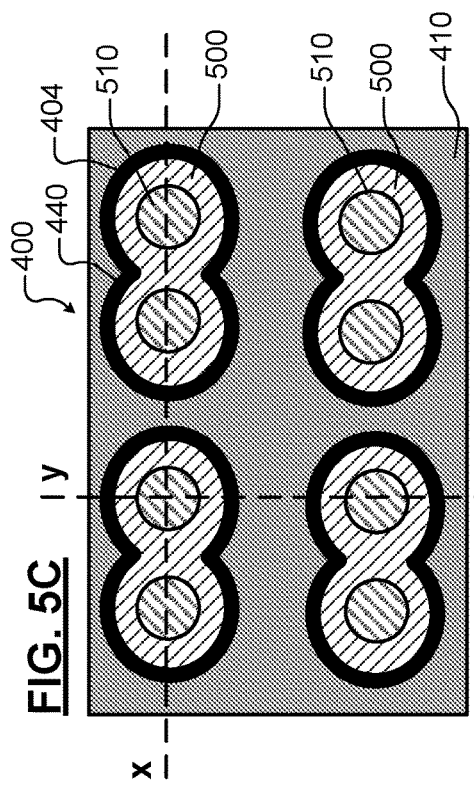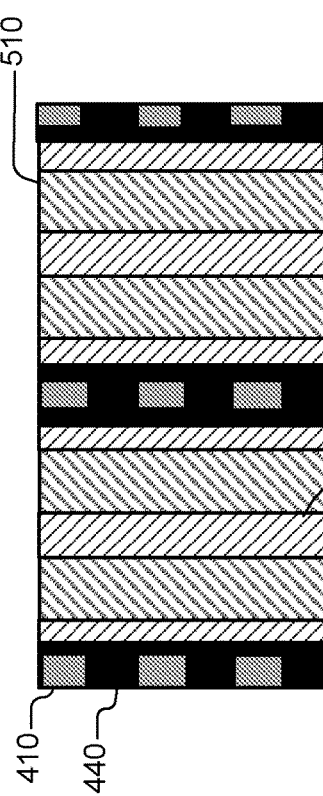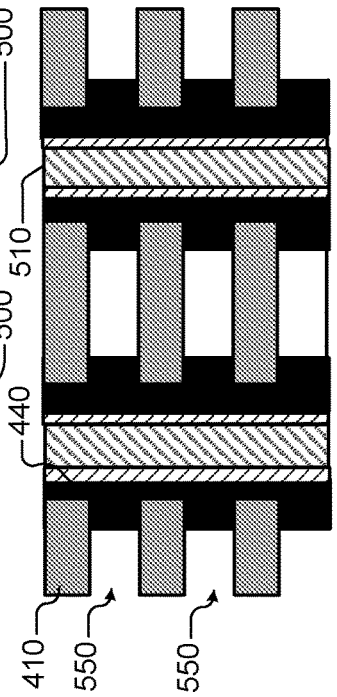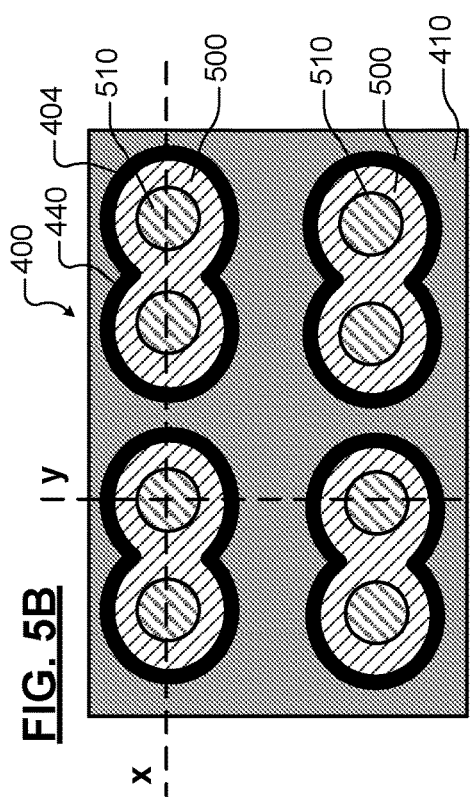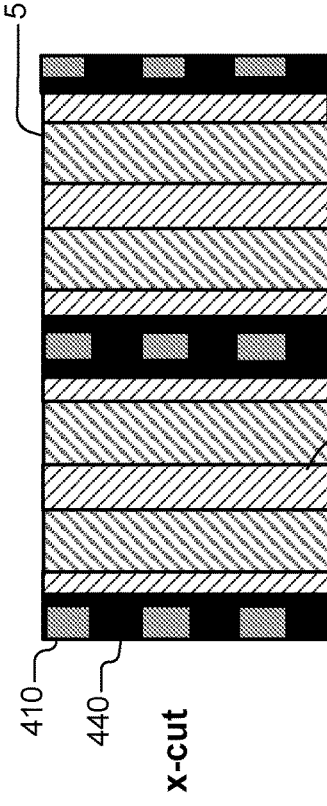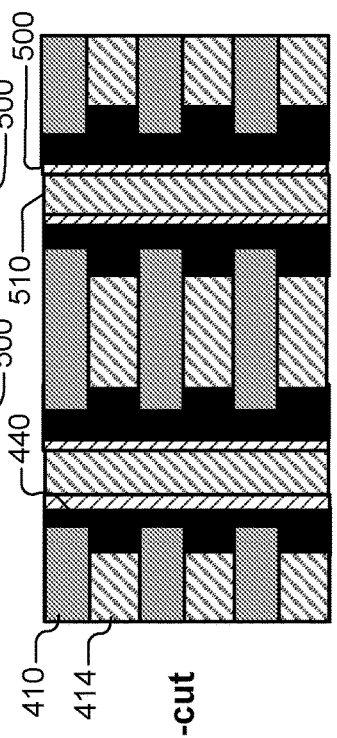
FIG. 5B
FIG. 5C
x-cut
y-cut

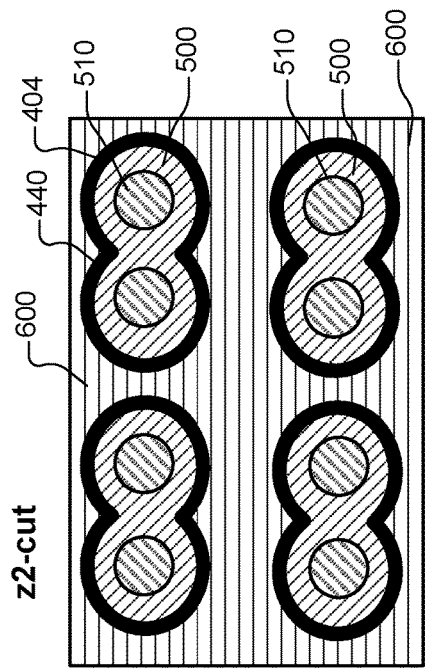
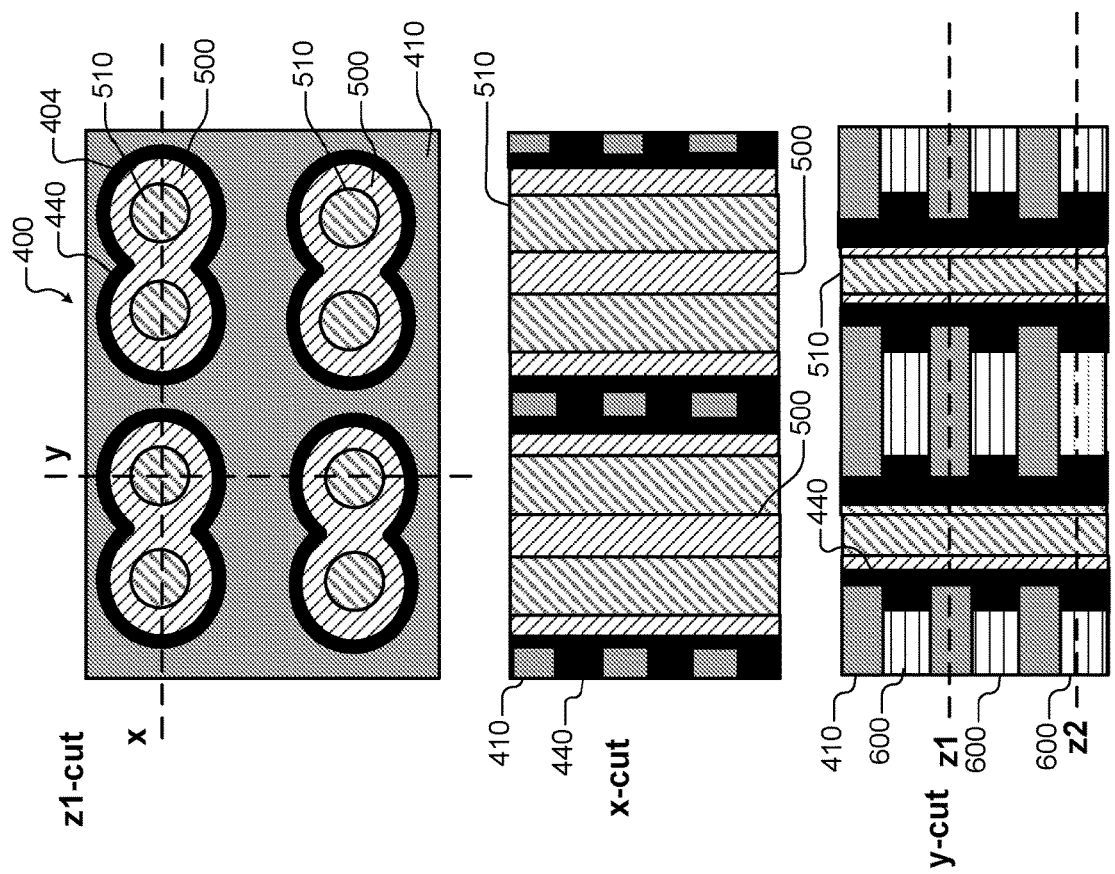
FIG. 6B
FIG. 6A

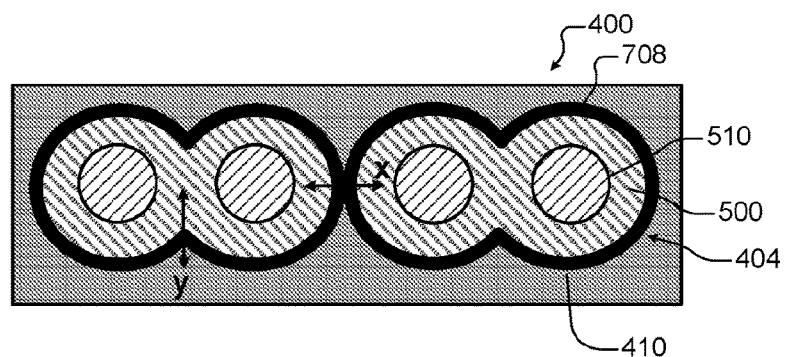
FIG. 7A
FIG. 7B
FIG. 7C
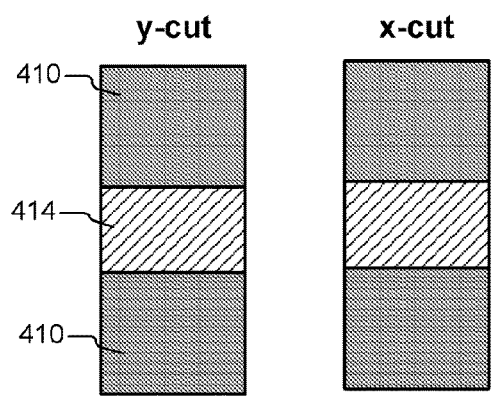
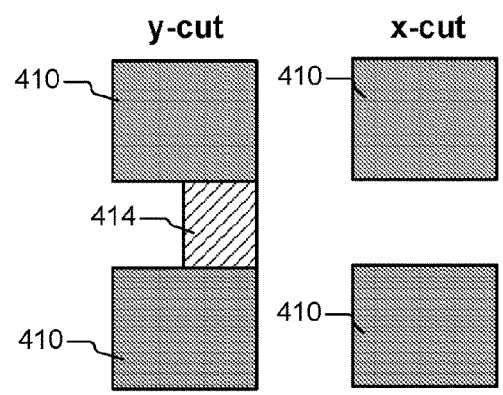
FIG. 7D
FIG. 7E
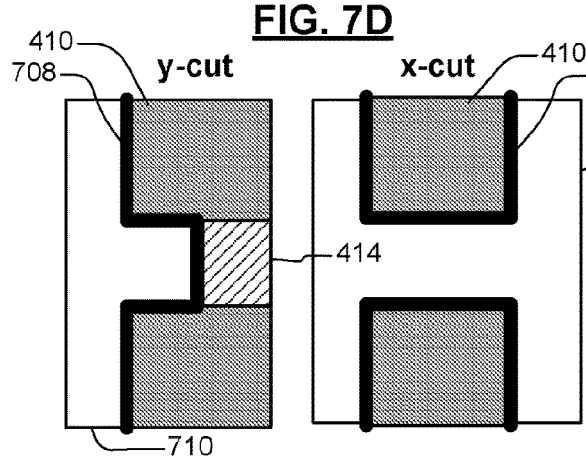
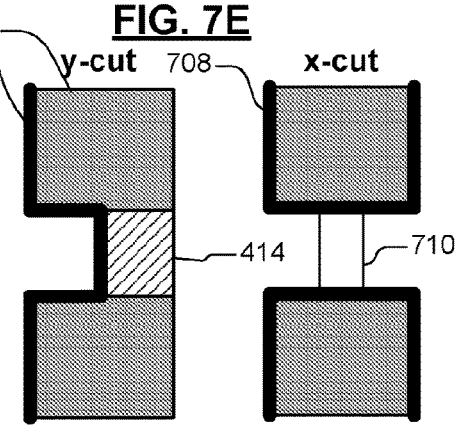

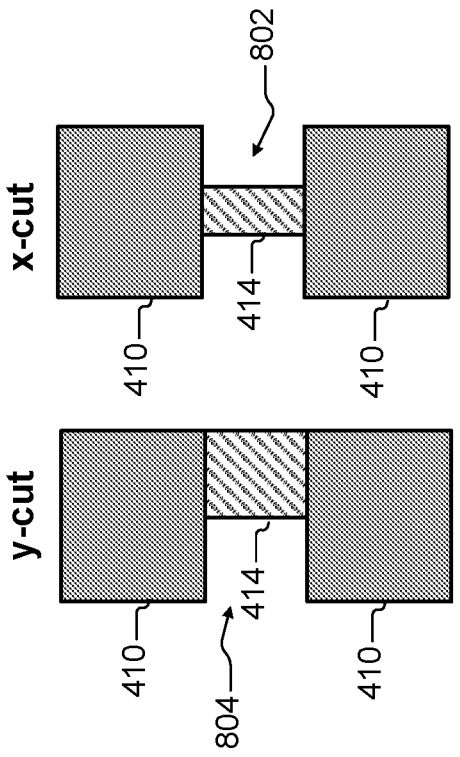
FIG. 8A
FIG. 8B
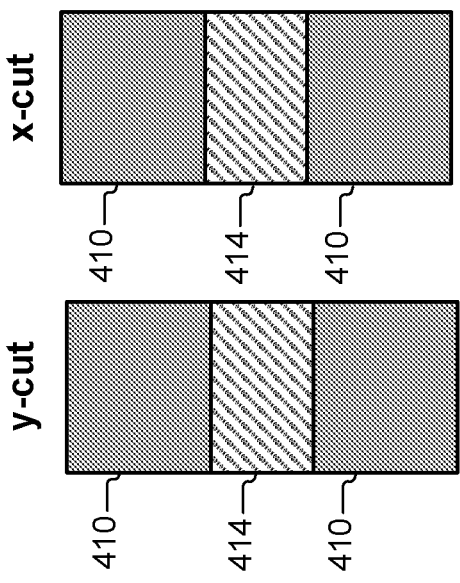
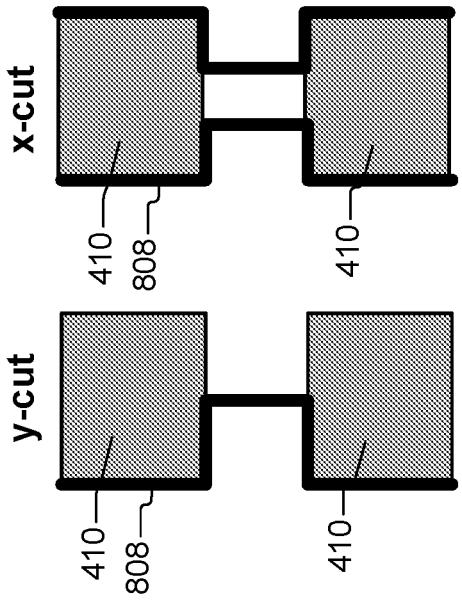
FIG. 8C
FIG. 8D
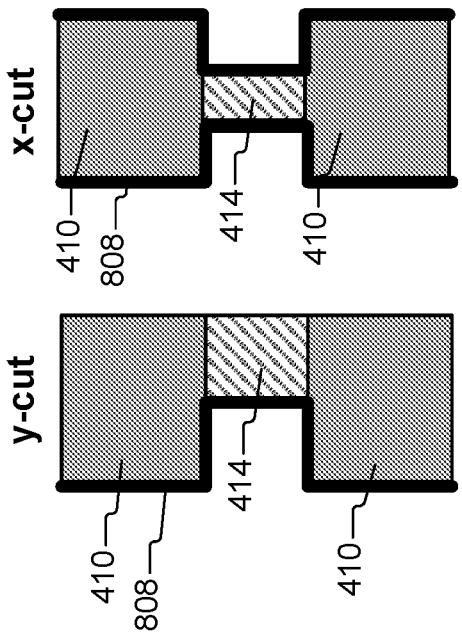

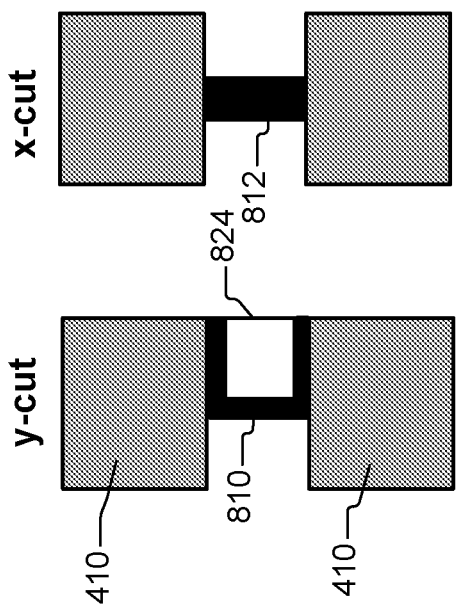
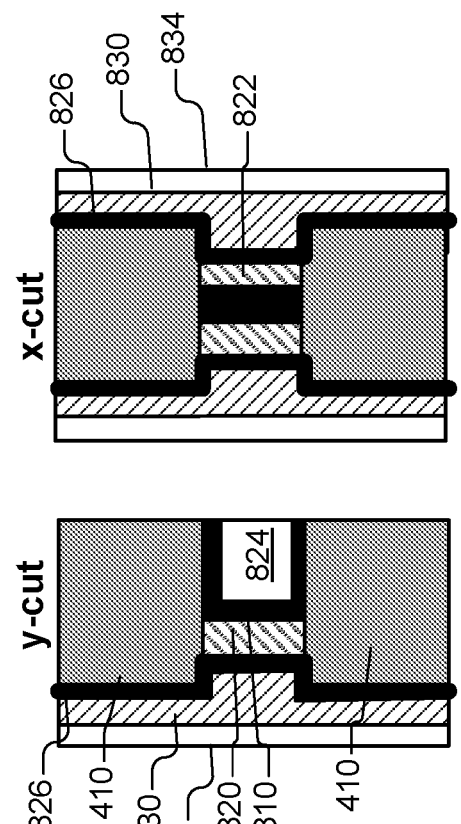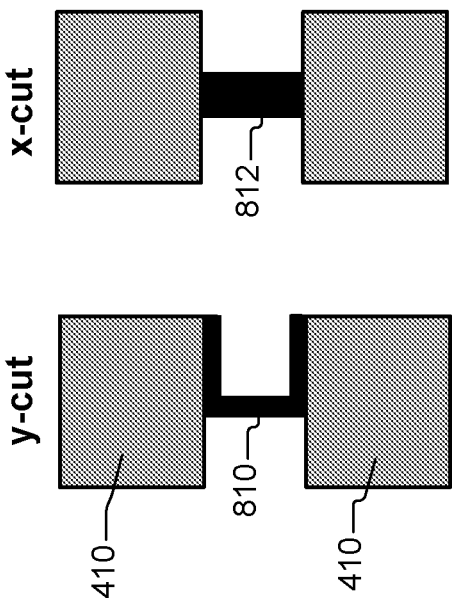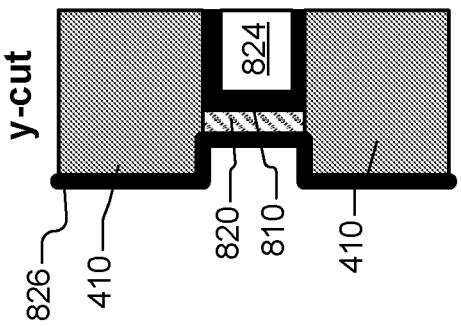

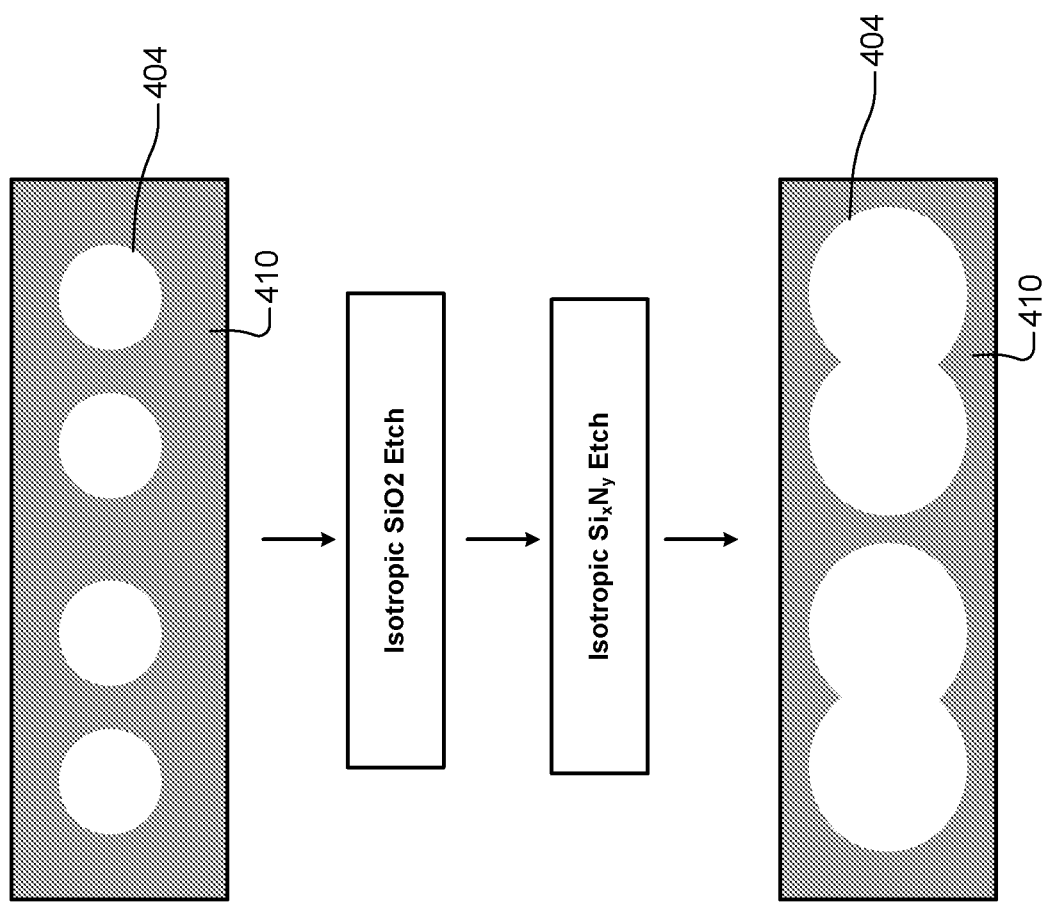

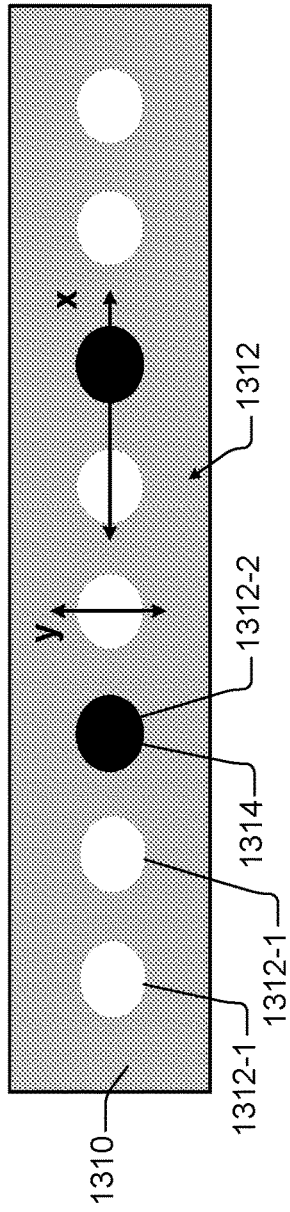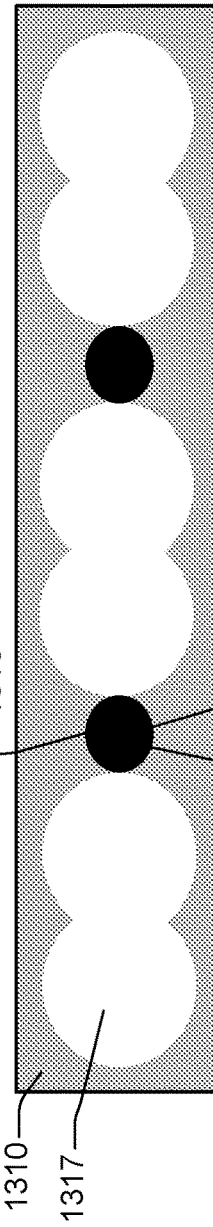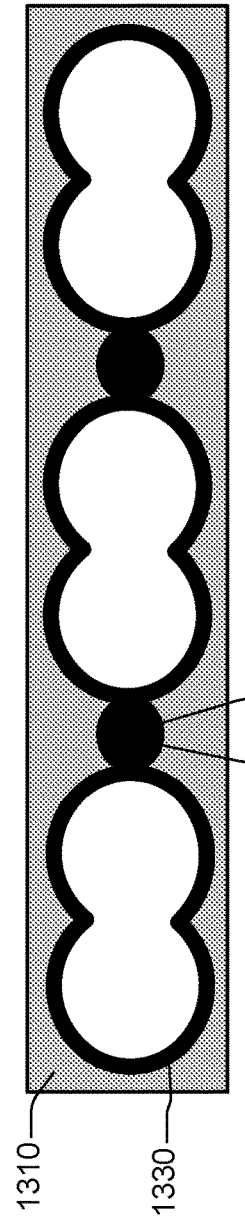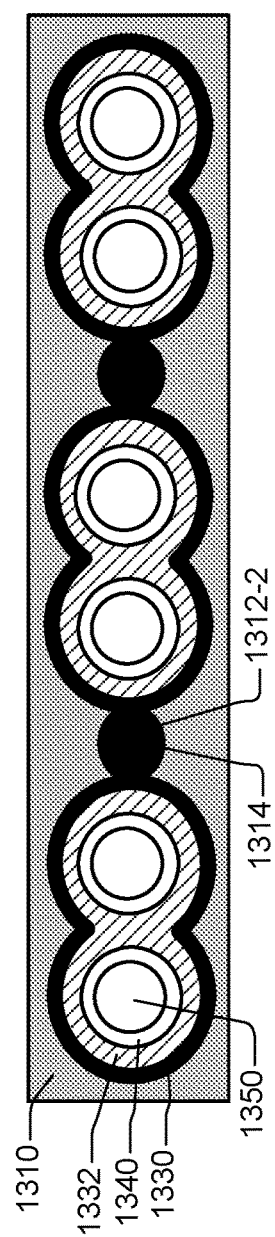

Side Views (x-cut)
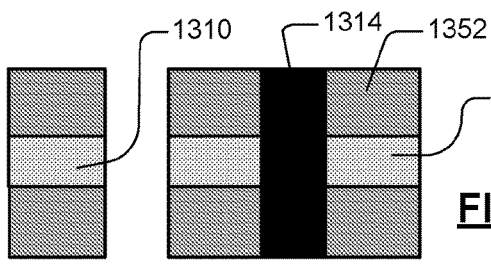
Side Views (y-cut)
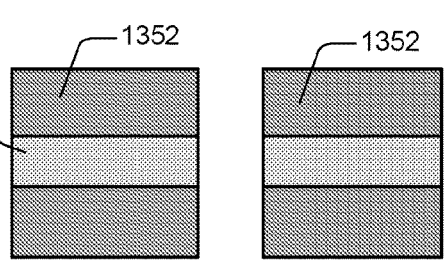
FIG. 14A
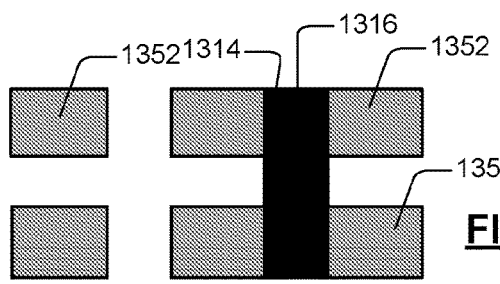
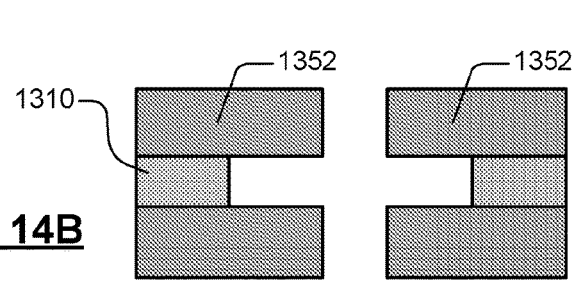
FIG. 14B
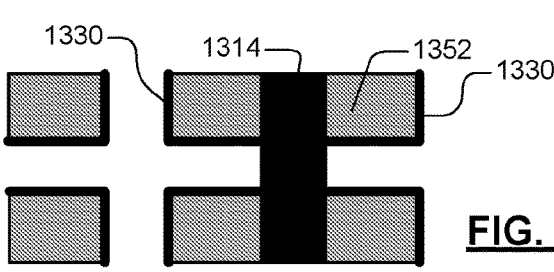
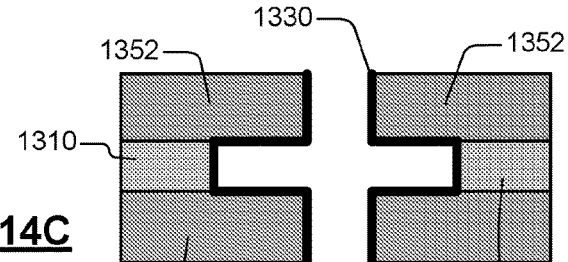
FIG. 14C
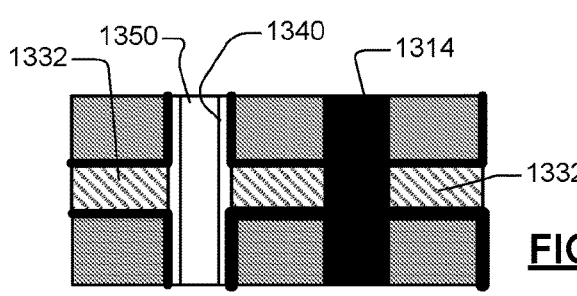
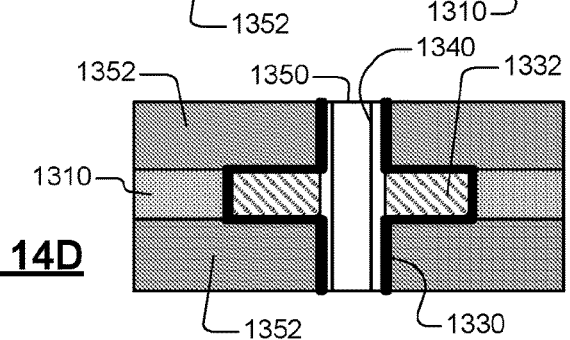
FIG. 14D

SELF-ALIGNED VERTICAL INTEGRATION OF THREE-TERMINAL MEMORY DEVICES

CROSS-REFERENCE TO RELATED APPLICATIONS

This application is a U.S. National Phase Application under 35 U.S.C. 371 of International Application No. PCT/US2019/057418, filed on Oct. 22, 2019, which claims the benefit of U.S. Provisional Application No. 62/775,615, filed on Dec. 5, 2018 and 62/751,089, filed on Oct. 26, 2018. The entire disclosures of the applications referenced above are incorporated herein by reference.

FIELD

The present disclosure relates to memory devices and more particularly to self-aligned vertical integration of three-terminal memory devices.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic devices include nonvolatile memory such as flash memory that is used to store data. The flash memory is typically implemented by one or more integrated circuits (ICs) including memory cells. As electronic devices shrink in size and use more data, the cost, density and access speed of the memory cells becomes increasingly important.

Initially, the memory cells were arranged in 2-D memory arrays. More recently, the memory cells are arranged in three dimensional (3D) arrays to increase density and reduce cost. Memory cells in 3-D memory arrays are typically two-terminal devices. Either a selector device is needed or the memory is not bit addressable. If the memory is not bit addressable, it is suitable for storage applications but is generally not suitable for working memory applications.

SUMMARY

A three-dimensional (3D) memory structure for memory cells include a plurality of oxide layers and a plurality of word line layers. The plurality of oxide layers and the plurality of word line layers are alternately stacked in a first direction. A plurality of double channel holes extend through the plurality of oxide layers and the plurality of word line layers in the first direction. The plurality of double channel holes have a peanut-shaped cross-section in a second direction that is transverse to the first direction.

In other features, the plurality of word line layers are recessed relative to the plurality of oxide layers in the plurality of double channel holes. The memory cells further comprise three terminal NOR memory cells. A multilayer stack is deposited on an inner surface of the plurality of double channel holes and defines a first cavity extending in the first direction.

In other features, the first cavity has a peanut-shaped cross-section in the second direction. The multilayer stack includes a blocking oxide layer, a charge trap layer and a gate oxide layer. The multilayer stack includes a blocking oxide layer, a ferroelectric layer and a gate oxide layer. The multilayer stack includes a blocking oxide layer, a spin-orbit torque (SOT) layer and a gate oxide layer.

In other features, a polysilicon layer is arranged on an inner surface of the first cavity. The polysilicon layer defines a second cavity and a third cavity extending in the first direction. The second cavity and the third cavity have an elliptical cross-section in the second direction. The polysilicon layer includes a P– layer. The polysilicon layer has an "8"-shaped cross-section in the second direction.

In other features, an N+ layer is arranged in the second cavity and the third cavity.

A method for fabricating a three-dimensional (3D) memory structure for memory cells includes providing a substrate including a plurality of oxide layers and a plurality of nitride layers. The plurality of oxide layers and the plurality of nitride layers are alternately stacked in a first direction. The method includes etching a plurality of double channel holes in the plurality of oxide layers and the plurality of nitride layers. The plurality of double channel holes extend in the first direction. The plurality of double channel holes have a peanut-shaped cross-section in a second direction that is transverse to the first direction.

In other features, the memory cells comprise three terminal NOR memory cells. The method includes partially etching back the plurality of nitride layers relative to the plurality of oxide layers in the plurality of double channel holes. The method includes depositing a multilayer stack on an inner surface of the plurality of double channel holes. The multilayer stack defines a first cavity extending in the first direction. The first cavity has a peanut-shaped cross-section in the second direction.

In other features, depositing the multilayer stack includes depositing a blocking oxide layer, a charge trap layer and a gate oxide layer. Depositing the multilayer stack includes depositing a blocking oxide layer, a ferroelectric layer and a gate oxide layer. Depositing the multilayer stack includes depositing a blocking oxide layer, a spin-orbit torque (SOT) layer and a gate oxide layer.

In other features, the method includes depositing a polysilicon layer on an inner surface of the first cavity in the plurality of double channel holes. The polysilicon layer defines a second cavity and a third cavity extending in the first direction. The second cavity and the third cavity have an elliptical cross-section in the second direction. The polysilicon layer includes a P– layer. The polysilicon layer has an "8"-shaped cross-section in the second direction.

In other features, the method includes depositing an N+ layer in the second cavity and the third cavity. The method includes cutting the substrate to at least partially expose portions of the plurality of nitride layers. The method includes etching the plurality of nitride layers. The method includes depositing conductive fill in etched locations of the plurality of nitride layers.

A three-dimensional (3D) memory structure for memory cells includes a plurality of oxide layers and a plurality of word line layers. The plurality of oxide layers and the plurality of word line layers are alternately stacked in a first direction. A plurality of double channel holes extend through the plurality of oxide layers and the plurality of word line layers in the first direction. The plurality of double channel holes have a peanut-shaped cross-section in a second direction that is transverse to the first direction. The plurality of word line layers are recessed in the second direction relative to the plurality of oxide layers in the plurality of double channel holes. A blocking dielectric layer is deposited on inner surfaces of the plurality of double channel holes, inner surfaces of the plurality of oxide layers in a first region at ends of the plurality of double channel holes between the plurality of oxide layers, and inner surfaces of the plurality of oxide layers and the plurality of word line layers in a second region at sides of the plurality of double channel holes between the plurality of oxide layers.

In other features, the memory cells comprise three terminal NOR memory cells. The plurality of double channel holes have a peanut-shaped cross-section in the second direction. A self-aligned contact is arranged in the first region between the ends of the plurality of double channel holes. A charge trap layer is located on opposite sides of the self-aligned contact in the first region. The charge trap layer is located in the second region adjacent to the blocking dielectric layer.

In other features, a gate oxide layer is arranged on the plurality of oxide layers and the charge trap layer in the plurality of double channel holes. A polysilicon layer is arranged on the gate oxide layer in the plurality of double channel holes. The polysilicon layer defines a P− channel layer. The polysilicon layer defines a first cavity extending in the first direction and a second cavity extending in the first direction. The first cavity and the second cavity have an elliptical cross-section in the second direction. The polysilicon layer has an "8"-shaped cross-section in the second direction. An N+ layer is arranged in the first cavity and in the second cavity.

A method for fabricating a three-dimensional (3D) memory structure for memory cells includes providing a substrate including a plurality of oxide layers and a plurality of nitride layers. The plurality of oxide layers and the plurality of nitride layers are alternately stacked in a first direction. The method includes etching a plurality of double channel holes in the plurality of oxide layers and the plurality of nitride layers. The plurality of double channel holes extend in the first direction. The plurality of double channel holes have a peanut-shaped cross-section in a second direction that is transverse to the first direction. The method includes etching back the plurality of nitride layers in a first region located at ends of the plurality of double channel holes between the plurality of oxide layers. The method includes partially etching back the plurality of nitride layers in a second region located at sides of the plurality of double channel holes between the plurality of oxide layers. The method includes depositing a blocking dielectric layer on inner surfaces of the plurality of double channel holes, inner surfaces of the plurality of oxide layers in the first region, and inner surfaces of the plurality of oxide layers and the plurality of nitride layers in the second region.

In other features, the plurality of double channel holes have a peanut-shaped cross-section. The method includes depositing a material in the plurality of double channel holes. The method includes etching the material to define a self-aligned contact in the first region between the ends of the plurality of double channel holes.

In other features, the method includes depositing a charge trap layer on opposite sides of the self-aligned contact in the first region. The charge trap layer is also deposited in the second region adjacent to the blocking dielectric layer.

In other features, the method includes depositing a gate oxide layer on the plurality of oxide layers and the charge trap layer in the plurality of double channel holes. The method includes depositing a polysilicon layer in the plurality of double channel holes. The polysilicon layer includes a P− layer. The polysilicon layer defines a first cavity and a second cavity extending in the first direction in the plurality of double channel holes.

In other features, the method includes depositing an N+ layer in the first cavity and the second cavity of the plurality of double channel holes.

A three-dimensional (3D) memory structure for memory cells includes a substrate including a plurality of oxide layers that are spaced apart and a plurality of double channel holes etched in the plurality of oxide layers. The plurality of double channel holes extend through the plurality of oxide layers in a first direction. The plurality of double channel holes have a peanut-shaped cross-section in a second direction that is transverse to the first direction. A first region is located at ends of adjacent ones of the plurality of double channel holes between adjacent ones of the plurality of oxide layers. A second region is located at sides of adjacent ones of the plurality of double channel holes between adjacent ones of the plurality of oxide layers. A blocking layer is located in the first region having an "I"-shaped cross-section and in the second region having an "C"-shaped cross-section.

In other features, the plurality of double channel holes have a peanut-shaped cross-section. A metal layer is arranged inside of the "C"-shaped cross-section of the blocking layer. The metal layer includes tungsten.

In other features, a charge trap layer is arranged on an outer surface of the "C"-shaped cross-section of the blocking layer and on outer surfaces of the "I"-shaped cross-section of the blocking layer. A gate oxide layer is arranged on exposed portions on the plurality of oxide layers and the charge trap layer in the plurality of double channel holes. A polysilicon layer is arranged on the gate oxide layer in the plurality of double channel holes. The polysilicon layer includes a P− layer. The polysilicon layer has an "8"-shaped cross-section in the second direction. The polysilicon layer defines a first cavity and a second cavity extending in the first direction in the plurality of double channel holes. An N+ layer is arranged in the first cavity and the second cavity of the plurality of double channel holes.

A method for fabricating a three-dimensional (3D) memory structure for memory cells includes providing a substrate including a plurality of oxide layers and a plurality of nitride layers. The plurality of oxide layers and the plurality of nitride layers are alternately stacked in a first direction. The method includes etching a plurality of double channel holes in the plurality of oxide layers and the plurality of nitride layers. The plurality of double channel holes extend in the first direction. The plurality of double channel holes have a peanut-shaped cross-section in a second direction that is transverse to the first direction. The method includes etching back the plurality of nitride layers in a first region located at ends of adjacent ones of the plurality of double channel holes between the plurality of oxide layers and in a second region located at sides of adjacent ones of the plurality of double channel holes between the plurality of oxide layers. The method includes depositing a self-aligned contact layer on inner surfaces of the plurality of double channel holes, and on surfaces of the plurality of oxide layers and the plurality of nitride layers in the first region and the second region.

In other features, the plurality of double channel holes have a peanut-shaped cross-section. The method includes etching the nitride layers in the first region and the second region of the plurality of double channel holes. The method includes selectively depositing a blocking layer on surfaces of the plurality of double channel holes in the first region and the second region. The blocking layer has an "I"-shaped cross-section in the first region and a "C"-shaped cross-section in the second region. The blocking layer includes dielectric material.

In other features, the method includes etching the self-aligned contact layer. The method includes depositing a metal layer on an inner surface of the blocking layer having the "C"-shaped cross-section. The metal layer includes tungsten. The method includes depositing a charge trap layer on an outer surface of the blocking layer having the "C"-shaped cross-section and on opposite surfaces of the blocking layer having the "I"-shaped cross section. The method includes depositing a gate oxide layer on the charge trap layer in the plurality of double channel holes. The method includes depositing a polysilicon layer on the gate oxide layer in the plurality of double channel holes. The polysilicon layer includes a P− layer. The polysilicon layer defines a first cavity and a second cavity extending in the first direction in the plurality of double channel holes.

In other features, the method includes depositing an N+ layer in the first cavity and the second cavity of the plurality of double channel holes.

A method for fabricating a three-dimensional (3D) memory structure for memory cells includes etching a plurality of holes in a first direction into a substrate. The substrate includes alternating layers of a first material and a second material stacked in the first direction. The method includes depositing a mask layer to mask pairs of the plurality of holes while leaving one unmasked hole located between every two of the pairs of the plurality of holes. The method includes depositing dielectric material in the unmasked ones of the plurality of holes, etching the mask layer to expose the pairs of the plurality of holes and isotropically etching the pairs of the plurality of holes to form a plurality of double channel holes extending in the first direction.

In other features, the plurality of double channel holes have a peanut-shaped cross-section in a second direction transverse to the first direction. The substrate includes alternating oxide layers and nitride layers. The first material includes oxide and the second material includes polysilicon.

In other features, the method includes etching the polysilicon in the plurality of double channel holes to recess the polysilicon relative to the oxide. The method includes depositing an interpolysilicon dielectric layer on an inner surface of the plurality of double channel holes. The interpolysilicon dielectric layer and the plurality of double channel holes have a peanut-shaped cross-section.

In other features, the method includes depositing a floating gate layer on an inner surface of the interpolysilicon dielectric layer. The floating gate layer defines a first cavity and a second cavity extending in the first direction.

In other features, the method includes etching back the floating gate layer to further define the first cavity and the second cavity. The method includes depositing a gate oxide layer in the first cavity and the second cavity. The method includes depositing polysilicon in the first cavity and the second cavity. The plurality of holes are arranged in a plurality of lines at evenly spaced intervals. The isotropic etching includes atomic layer etching. The isotropic etching includes radical etching. The plurality of holes have an elliptical cross-section in first direction. The memory cells of the 3D memory structure include NOR memory cells with a floating gate.

A three-dimensional (3D) memory structure for memory cells includes a substrate including alternating layers of a first material and a second material stacked in a first direction. The second material is different than the first material. A plurality of double channel holes extend in the first direction into the substrate and have a peanut-shaped cross section in a second direction transverse to the first direction. A plurality of isolation pillars extend in the first direction and each isolation pillar is arranged between a pair of double channel holes.

In other features, the first material includes oxide and the second material includes nitride. The first material includes oxide and the second material includes polysilicon. An interpolysilicon dielectric layer is arranged on an inner surface of the plurality of double channel holes. The interpolysilicon dielectric layer has a peanut-shaped cross-section in the second direction. A floating gate layer is arranged on an inner surface of the interpolysilicon dielectric layer and defines a first cavity and a second cavity extending in the first direction in the plurality of double channel holes.

In other features, a gate oxide layer is arranged on an inner surface of the floating gate layer in the first cavity and the second cavity in the plurality of double channel holes. A polysilicon layer is arranged on the gate oxide layer in the first cavity and the second cavity. The polysilicon is recessed relative to the oxide. The memory cells include NOR memory cells with a floating gate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is an electrical schematic of an example of a three-terminal NOR memory device;

FIG. 1B is a perspective view of an example of a 3-D vertical, two-terminal memory device;

FIGS. 4A to 6B are cross-sectional views illustrating fabrication of an example of the 3-D vertical, three-terminal memory device according to the present disclosure;

FIG. 7A is a plan view illustrating x-cut and y-cut orientations in cross-sectional views of FIGS. 7B to 7I;

FIGS. 7B to 7I are cross-sectional views illustrating fabrication of an example of the 3-D vertical, three-terminal memory device according to the present disclosure;

FIGS. 8A to 8H are cross-sectional views illustrating fabrication of an example of the 3-D vertical, three-terminal memory device according to the present disclosure;

FIG. 10 is a plan view illustrating an example of creation of double channel holes according to the present disclosure;

FIGS. 13A to 13D are plan views illustrating the fabrication of an example of a memory device with a 3-D NOR with a floating gate according to the present disclosure;

FIGS. 14A to 14D are cross-sectional views illustrating an example of fabrication of a 3-D NOR with a floating gate according to the present disclosure.

In the drawings, reference numbers may be reused to identify similar and/or identical elements.

DETAILED DESCRIPTION

A 3-D, three-terminal memory device according to the present disclosure includes three terminals for addressing each memory cell. Methods described herein can be used to fabricate the 3-D, three-terminal memory device and to integrate a third terminal in a vertical direction in a self-aligned manner using etching and deposition. The 3-D, three-terminal memory device uses hole etching rather than line etching typically used in crosspoint arrays. This approach allows extension to a higher number of tiers than line etching processes, which increases storage density and reduces cost.

The 3-D, three-terminal memory device includes NOR rather than NAND devices. In NAND and NOR devices, the wordline is connected to every memory cell. In NAND devices, the bitline is connected to the source/drain chain. In NOR devices, the bitline is connected to every other device (in designs with a reference cell). In NAND devices, there is no separate connection to the source/drain. In NOR devices, every device pair is connected to ground. NAND devices are two terminal. NOR devices are three terminal.

In the description that follows, a 3-D vertical structure includes three-terminal, NOR memory devices as shown in FIG. 1A. In FIG. 1B, an example of a memory device 100 is a bit addressable, two-terminal device is shown. The memory device 100 includes a plurality of word lines 110-1, 110-2, ... and 110-W or parallel tiers (where W is an integer greater than two (and where W can be greater than 25, 50, 75 or 100) (collectively word lines 110) arranged in parallel planes. The memory device 100 further includes a plurality of bit lines 120-1, 120-2, ..., and 120-B (where B is an integer greater than two) (collectively bit lines 120) extending in a first direction in a plane parallel to the parallel word line planes.

The memory device 100 further includes a plurality of select lines 124-1, 124-2, ..., and 124-S (where S is an integer greater than two) (collectively select lines 124) extending in a second direction (e.g. transverse to the first direction) in a plane parallel to the parallel word line planes. The memory device 100 further includes pillar electrodes 130-11, 130-12, ..., and 130-WB (collectively pillar electrodes 130) extending in a direction transverse to the parallel word line planes. Memory devices 134 are arranged at junctions of the pillar electrodes 130 and the word lines 110.

Figure 2B:
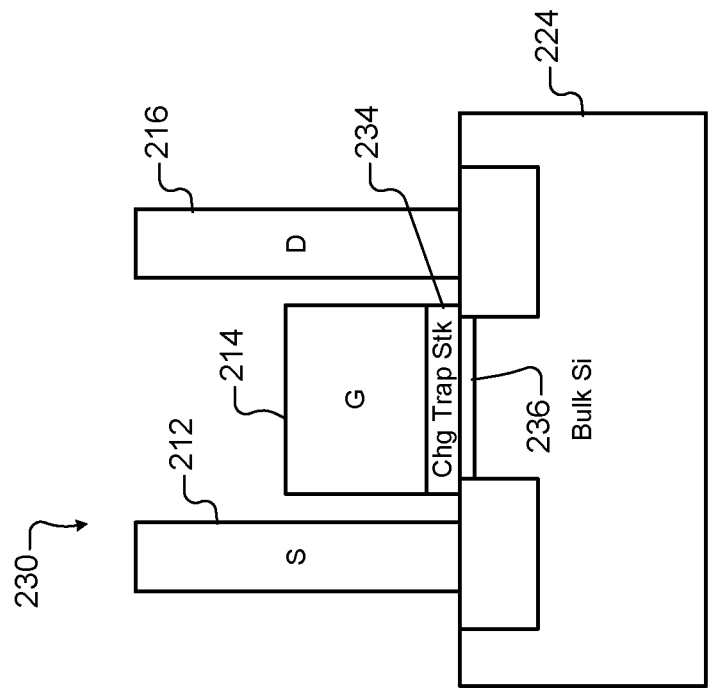
FIGS. 2A to 2C are side cross-sectional views of various examples of three-terminal memory devices including ferroelectric RAM, NOR flash and spin-orbit torque RAM.
Figure 2A:
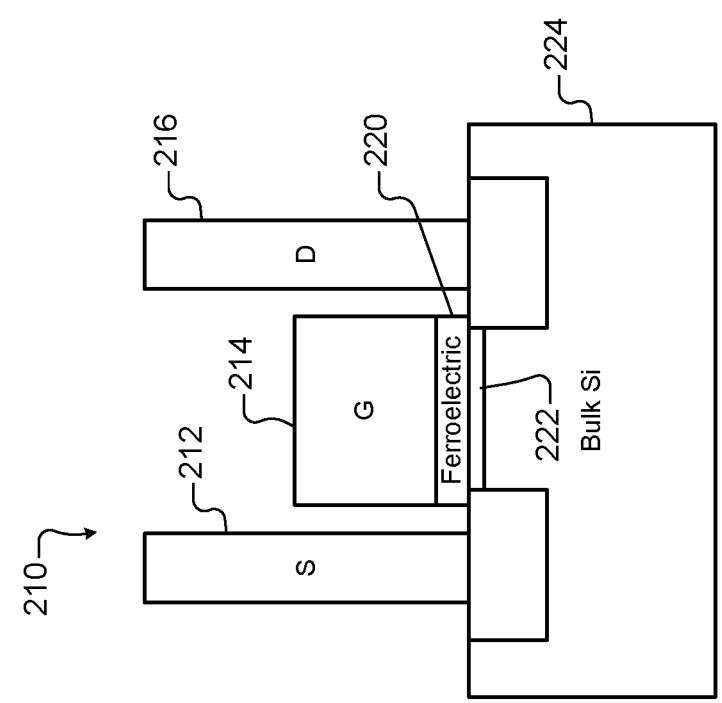
Figure 2C:
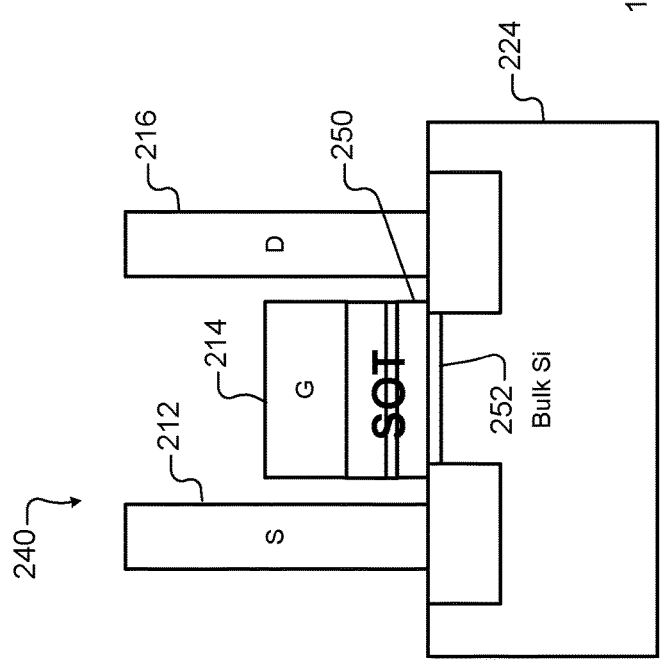

Referring now to FIGS. 2A to 2C, various three-terminal memory devices can be used in the 3-D, three-terminal memory described herein. While the foregoing description relates to three-terminal NOR flash, other types of memory cells can be used. In FIG. 2A, a ferroelectric field effect transistor (FeFET) memory cell 210 is shown. The FeFET memory cell 210 includes a source 212, a gate 214 and a drain 216. A ferroelectric stack 220 is arranged between the gate 214 and a layer 222 arranged in bulk silicon 224. The FeFET memory cell 210 operates about as fast as DRAM.

In FIG. 2B, NOR flash memory cell 230 is shown. The NOR flash memory cell 230 includes the source 212, the gate 214 and the drain 216. A charge trap stack 234 is arranged between the gate 214 and a layer 236 arranged in the bulk silicon 224. The NOR flash memory cell 230 operates faster than NAND memory.

In FIG. 2C, spin-orbit torque (SOT) magnetoresistive (MRAM) memory cell 240 is shown. The SOT MRAM memory cell 240 includes the source 212, the gate 214 and the drain 216. An SOT stack 250 is arranged between the gate 214 and a layer 252 arranged in the bulk silicon 224. The SOT MRAM memory cell 240 operates faster than SST MRAM.

Figure 3A:
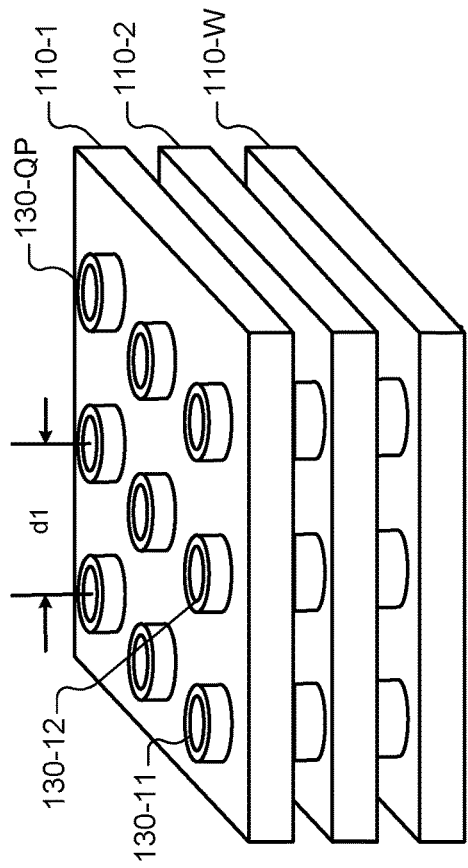
FIGS. 3A and 3B are perspective views of 3-D vertical, two-terminal memory devices.
Figure 3B:
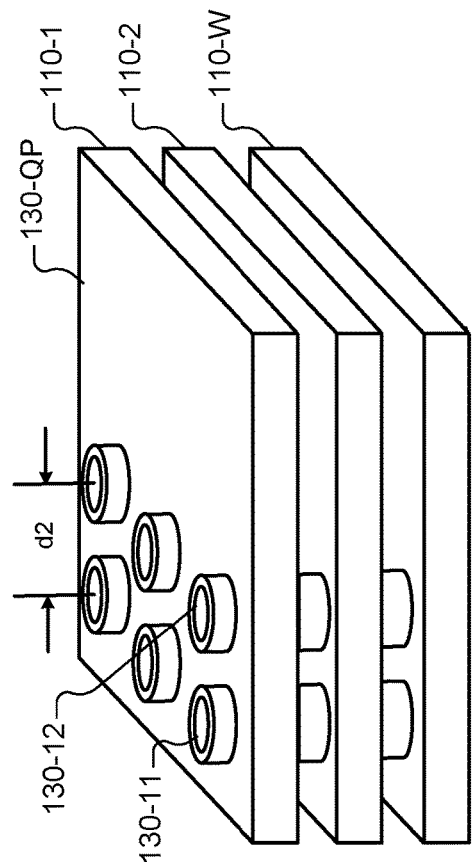

Referring now to FIGS. 3A and 3B, two terminal memory devices are shown. Adding the third terminal for each memory cell typically introduces a 50% bit density penalty due to the third terminal. To make the devices shown in FIGS. 3A and 3B three terminal devices, systems and methods described herein include different pillar electrodes (source and drain pillar electrodes). Systems and methods described herein arrange a transistor between the pillar electrodes and move the pillar electrodes closer together to reduce the penalty for the third terminal.

As will be described further below, the 3-D vertical, three-terminal memory devices according to the present disclosure reduce the density penalty due to the three terminal device. In some examples, the distance between at least some of the pillar electrodes 130 is reduced from a uniform distance d1 to a non-uniform distance d2 (e.g. in double channel holes described further below), where d2<d1.

Referring now to FIGS. 4A to 6B, fabrication of the 3-D vertical, three-terminal memory device is shown. In FIG. 4A, a plan view of a substrate 400 includes an oxide layer 410 with a plurality of double channel holes 404. The plurality of double channel holes 404 have a peanut-shaped cross-section. The plurality of double channel holes 404 are used to reduce the density penalty due to the third terminal. The substrate 400 includes alternating silicon dioxide ($SiO_2$) or oxide layers 410 and silicon nitride ($Si_xN_y$) layers 414 (e.g. ONON . . . ) stacked in a first direction. Etching of the oxide layers 410 in the first or vertical direction and the nitride layers 414 is performed to define the double channel holes 404.

Figure 4C:
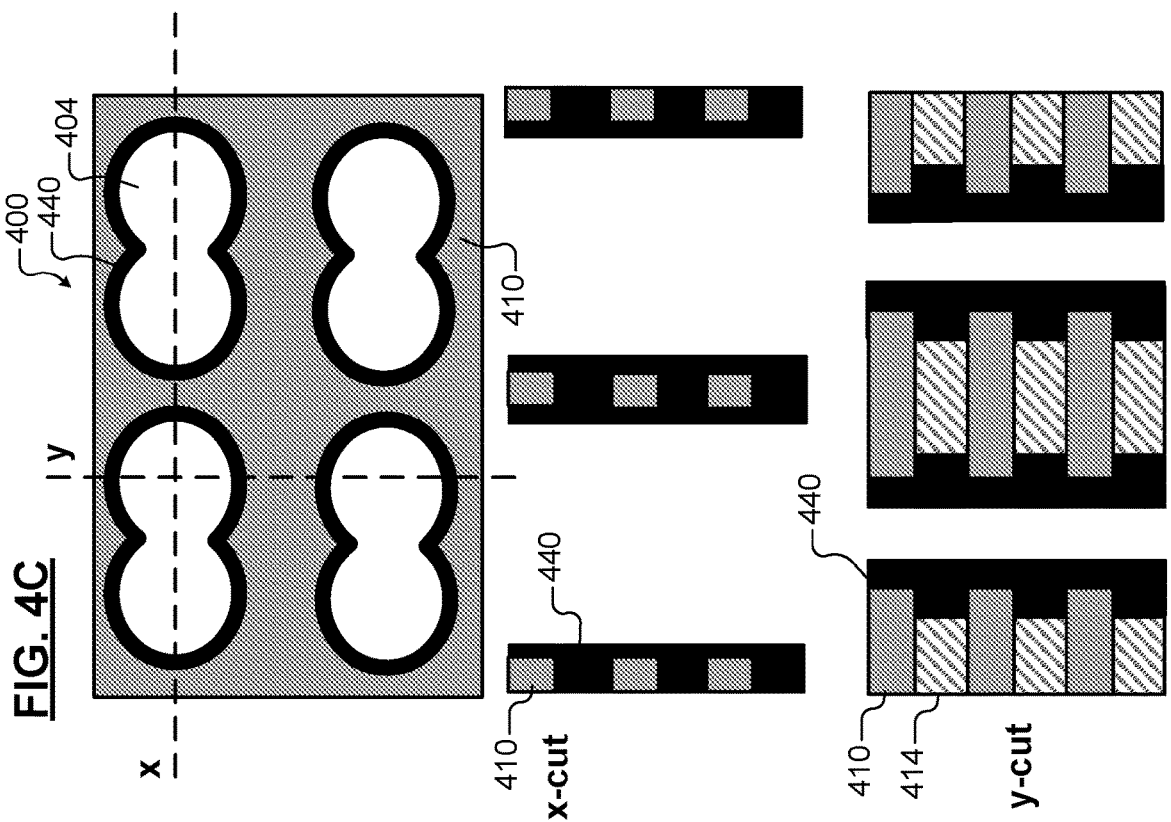

In FIG. 4B, isotropic etching of the nitride layers 414 is performed to etch back exposed portions of the nitride layers 414 relative to the oxide layers 410 in the double channel holes 404 in a second or horizontal direction. The second direction is transverse to the first direction. In FIG. 4C, a blocking oxide layer, a nitride layer and a gate oxide layer (collectively shown as multilayer stack 440) are deposited on the oxide and nitride layers 410, 414 as will be described further below. The multilayer stack 440 in the double channel holes defines a first or vertical cavity having a peanut-shaped cross-section (e.g. resembling an outline of a figure "8").

Figure 5A:
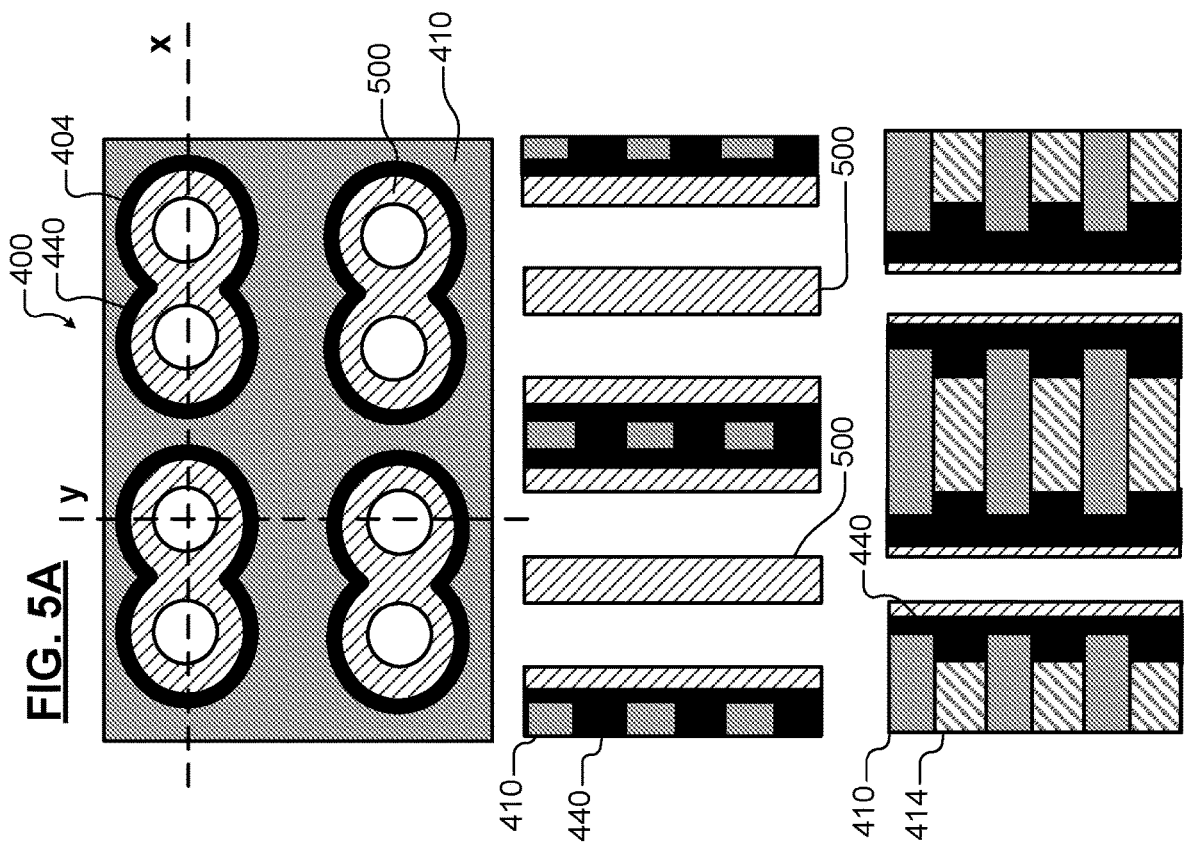

In FIG. 5A, P⁻ channel polysilicon fill and etch back is performed to create a P⁻-channel polysilicon layer 500 on inner surfaces of the multilayer stack 440. After etch back, the P⁻ channel polysilicon layer 500 defines adjacent vertical cavities in the double channel holes 404 and has an "8"-shaped cross-section. In some examples, the adjacent vertical cavities have an elliptical or circular cross-section. In FIG. 5B, N⁺ wordline/bitline layers 510 are deposited in the adjacent vertical cavities in each of the double channel holes.

In FIG. 5C, etching is performed to etch the nitride layer 414 located between the oxide layers 410 as shown at 550 to define word lines. In some examples, the substrate is cut or slit in one or more locations to expose the nitride layer 414 prior to etching.

Figure 6C:
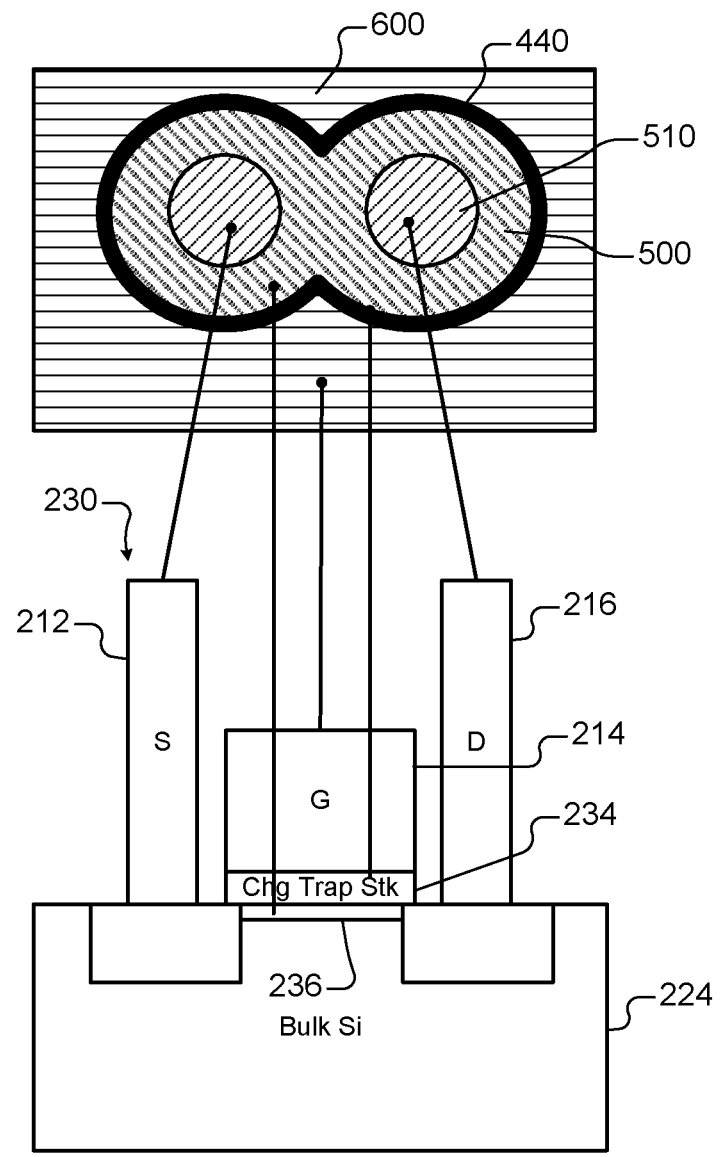
FIG. 6C illustrates mapping of a 2-D memory device onto a 3-D memory device.

In FIG. 6A, conductive fill 600 is deposited in the openings to form word lines formerly occupied by the nitride layer 414 as shown at 550. In some examples, the conductive fill comprises tungsten (W). In FIG. 6B, a cross-sectional view through the substrate at one layer of the conductive fill 600 is shown. In FIG. 6C, mapping of a 2-D memory device onto a 3-D memory device is shown.

Figure 6D:
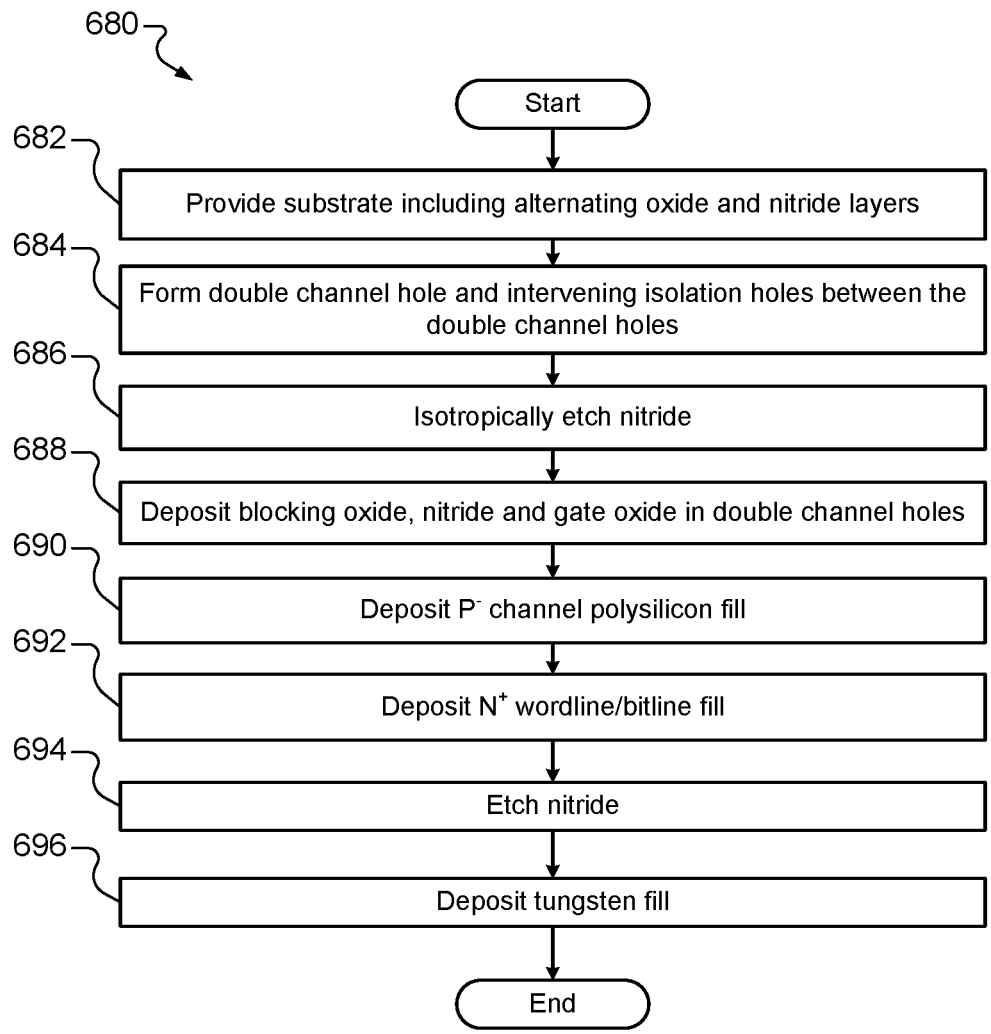
FIG. 6D is a flowchart of an example of a method for fabricating the 3-D vertical, three-terminal memory device according to the present disclosure.

In FIG. 6D, a method 680 for fabricating the 3-D vertical, three-terminal memory device is shown. At 682, the substrate 400 is provided and initially includes a stack of alternating oxide and nitride layers 410, 414, respectively. At 684, double channel holes are formed. In some examples, intervening isolation holes are formed between the double channel holes (as will be described below). At 686, the nitride layer 414 is isotopically etched to recess the nitride layer 414. At 688, the multilayer stack 440 (includes the blocking oxide, a charge trap layer (e.g. nitride) and the gate oxide) are deposited in the double channel holes 404. At 690, the P⁻ channel polysilicon layer 500 is deposited. At 692, the N⁺ word line/bit line layer 510 is deposited. In some examples, the substrate is cut or slit in one or more locations to expose the nitride prior to etching. At 694, the nitride layer 414 is etched. At 696, the conductive fill 600 such as tungsten is deposited to form word lines in the former location of the nitride layer 414.

Figure 7F:
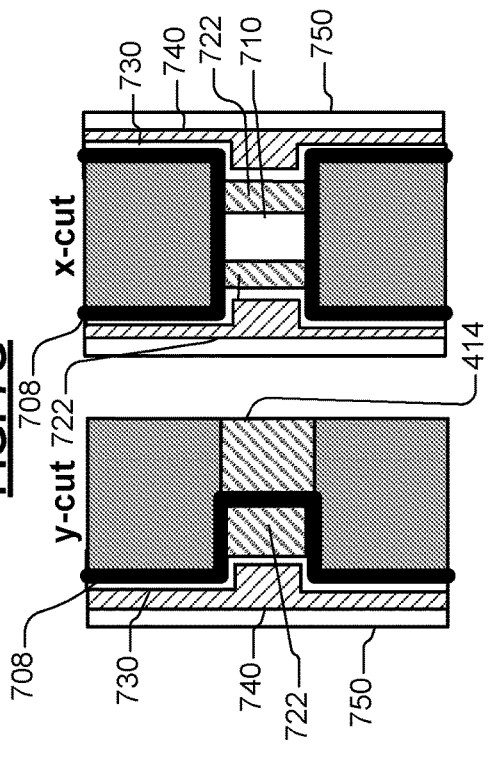

Referring now to FIG. 7A, orientations of x-cut and y-cut cross-sectional views of FIGS. 7B to 7I are shown. In FIGS. 7B to 7I, cross-sectional views illustrating fabrication of the 3-D vertical, three-terminal memory device are shown. In FIG. 7B, the substrate is shown after high aspect ratio etching of the double channel holes. In FIG. 7C, the substrate is shown after etching to recess the nitride layer 414. In some examples, the nitride layer 414 is removed in first regions at ends double channel holes 404 between the oxide layers and partially removed in second regions adjacent to sides of the double channel holes 404 between the oxide layers.

In FIG. 7D, the substrate is shown after a blocking dielectric layer 708 is deposited in the double channel holes 404. The blocking dielectric layer 708 is deposited on the oxide layers 410 and the nitride layer 414 in the second region and on the oxide layer 414 in the first region. A self-aligned contact (SAC) oxide layer 710 is deposited on the blocking dielectric layer 708 in the double channel holes 404.

In FIG. 7E, the substrate is shown after etching is performed to recess the SAC oxide layer 710. The SAC oxide layer 710 is removed in the second region except for a location centered between the oxide layers 410 in the y-cut view in the first region. In FIG. 7F, the substrate is shown after deposition of a nitride charge trap layer 722 (and etching to recess the charge trap layer 722) in the double channel holes 404. A gate oxide layer 730 is deposited in the double channel holes 404 on the charge trap layer 722.

Figure 7G:
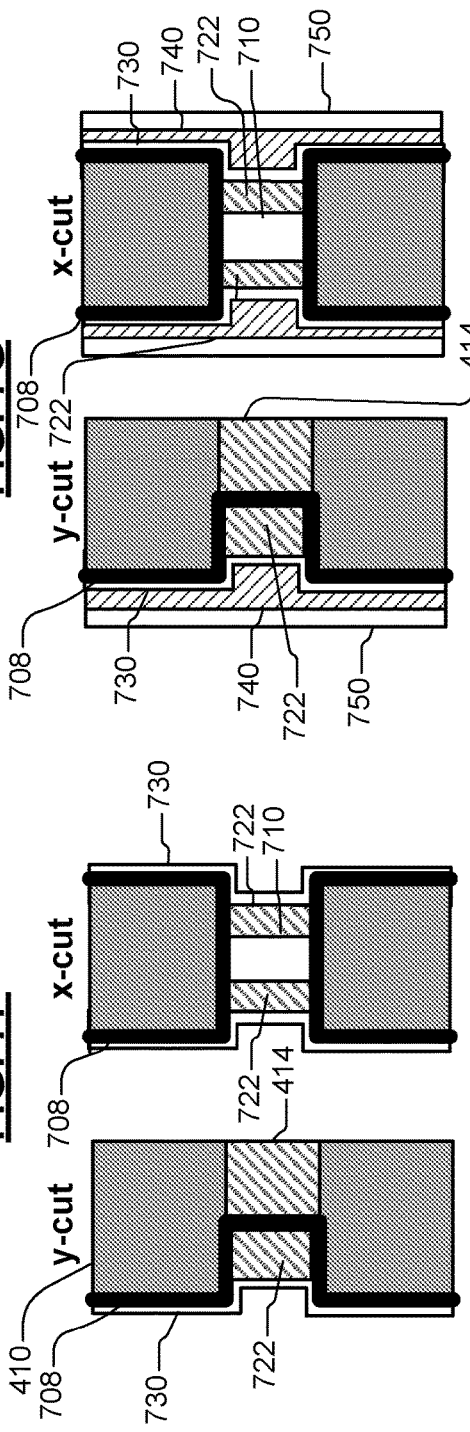
Figure 7H:
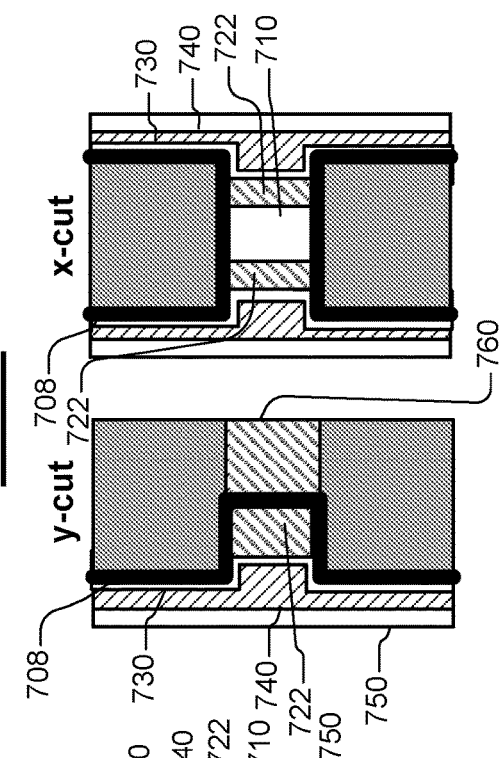
Figure 7I:
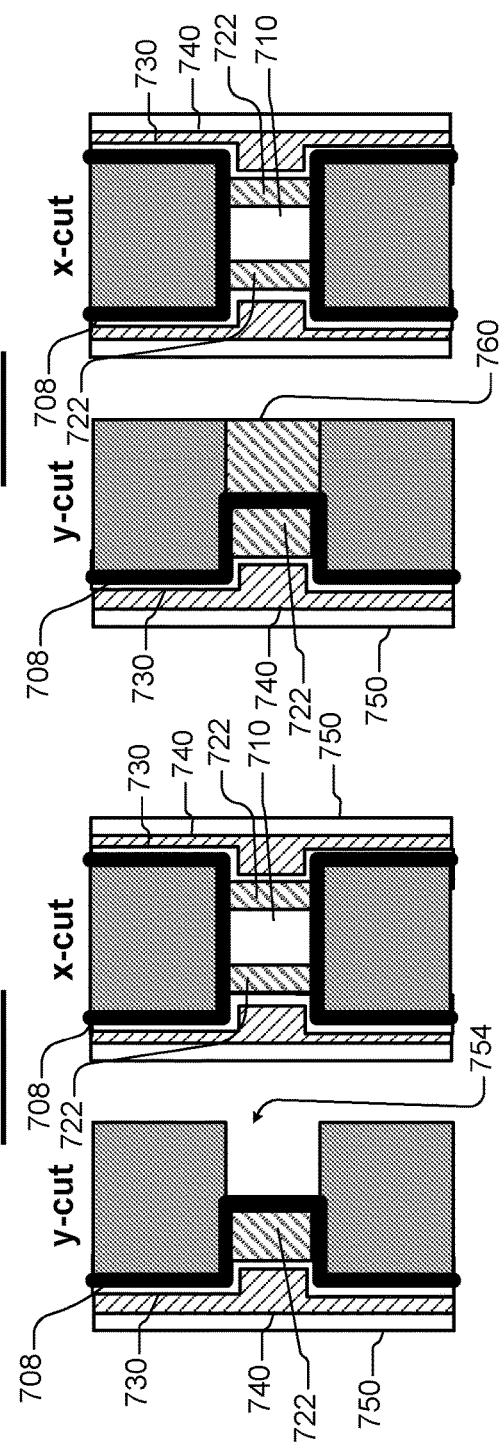

In FIG. 7G, the substrate is shown after deposition and recessing of a P⁻ channel layer 740 in the double channel holes 404. An N⁺ fill layer 750 is deposited in the double channel holes 404 on the P⁻ channel layer 740. In some examples, the substrate is cut or slit in one or more locations to expose the nitride layer for a subsequent etching step. In FIG. 7H, the substrate is shown after etching of the nitride layer 414 at 754 in the x-cut view. At 7I, deposition of conductive fill 760 is performed at 754 to fill the location formerly occupied by the nitride layer 414 and create word lines. In some examples, the conductive fill 760 includes tungsten (W).

Figure 7J:
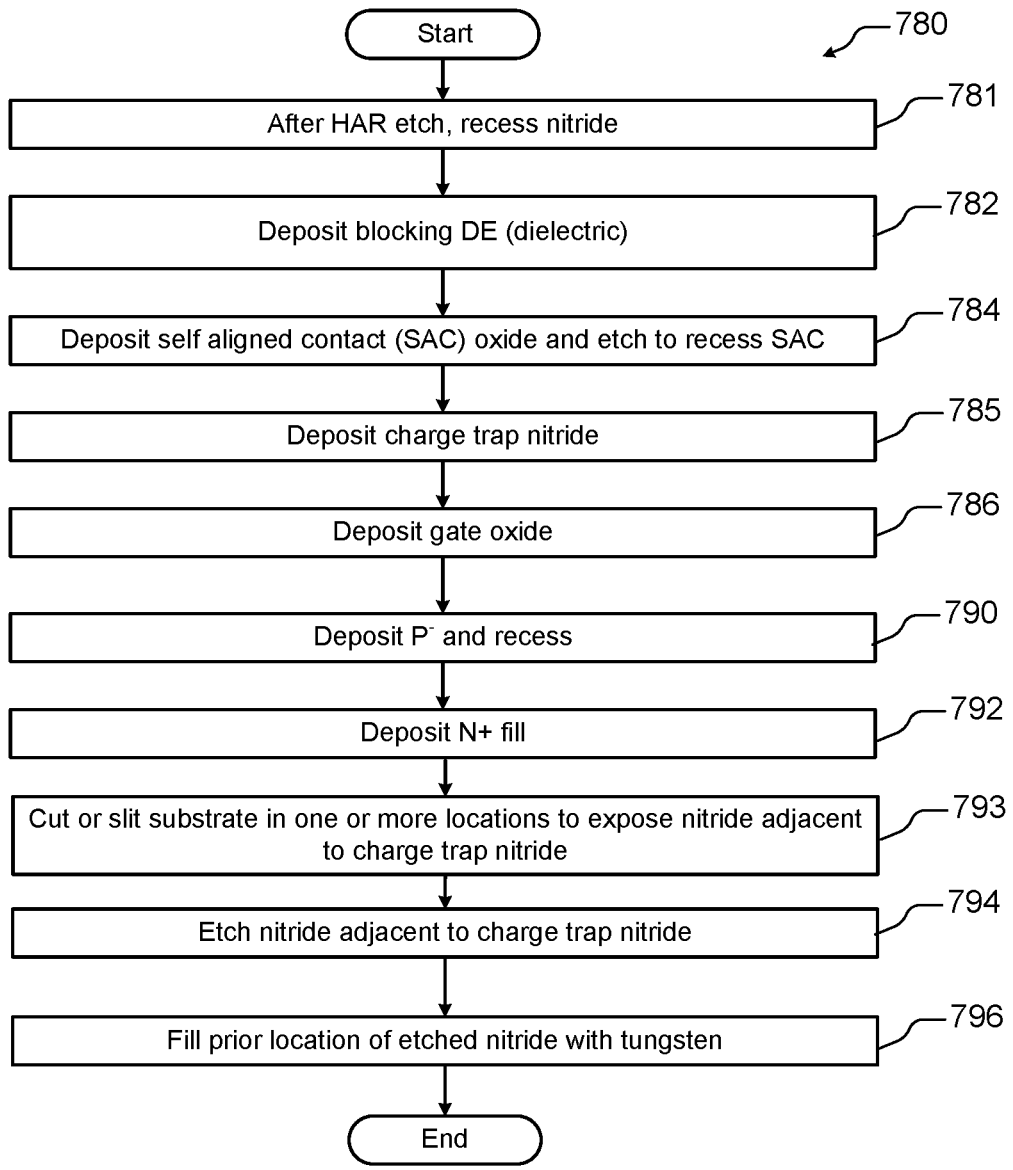
FIG. 7J is a flowchart of an example of a method for fabricating the 3-D vertical, three-terminal memory device according to the present disclosure.

Referring now to FIG. 7J, a method 780 for fabricating the 3-D vertical, three-terminal memory device is shown. At 781, the nitride layer 414 is recessed (after using HAR etching to the double channel holes). At 782, the blocking dielectric layer 708 is deposited. At 784, the SAC oxide layer 710 is deposited and etched back. At 785, the charge trap layer 722 is deposited. At 786, the gate oxide layer 730 is deposited. At 790, the P⁻ channel layer 740 is deposited and recessed. At 792, the N⁺ fill layer 750 is deposited. At 793, the substrate is optionally cut or slit in one or more locations to expose the nitride layer for a subsequent etching step. At 794, the nitride layer 414 is etched adjacent to the charge trap layer 722. At 796, the prior location of the nitride layer 414 is filled with the conductive fill 760.

Referring now to FIGS. 8A to 8H, cross-sectional views illustrating fabrication of the 3-D vertical, three-terminal memory device are shown. In FIG. 8A, the substrate is shown after high aspect ratio (HAR) etching to define the plurality of double channel holes. In FIG. 8B, the substrate is shown after etching to recess the nitride layer 414. First regions 802 are located at ends of adjacent ones of the plurality of double channel holes between the plurality of oxide layers. Second regions 804 are located at sides of adjacent ones of the plurality of double channel holes between the plurality of oxide layers. Since etching occurs on both sides in the first regions 802, the nitride 414 is centered in the first regions 802 after etching. Since etching occurs only on one side in the second regions 804, the nitride 414 is etched from only one side as shown. In FIG. 8C, a SAC oxide layer 808 is deposited to shape dielectric blocking layers 810, 812 that will be subsequently deposited (see FIG. 8E).

In some examples, the substrate is optionally cut or slit in one or more locations to expose the nitride layer 414. In FIG. 8D, the nitride layer 414 is etched. In FIG. 8E, the dielectric blocking layers 810, 812 are deposited and shaped by the SAC oxide layer 808. Then, the SAC oxide layer 808 is etched. In FIG. 8F, conductive fill 824 is deposited. In FIG. 8G, nitride is deposited and etched back to form charge trap layers 820, 822. A gate oxide layer 826 is deposited. In FIG. 8H, the substrate is shown after deposition and recessing of a P⁻ channel layer 830. An N⁺ fill layer 834 is deposited on the P⁻ channel layer 830.

Figure 8I:
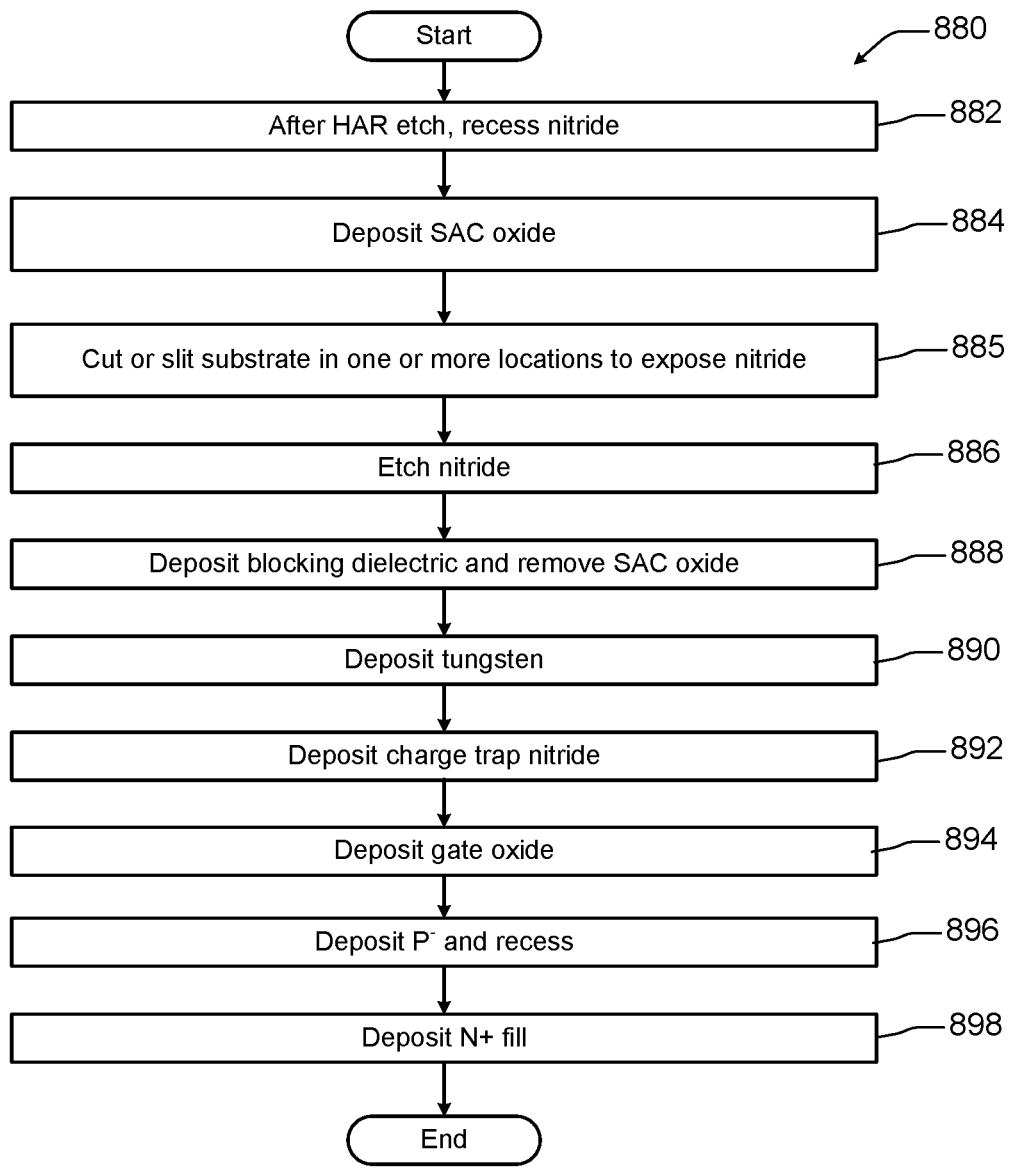
FIG. 8I is a flowchart of an example of a method for fabricating the 3-D vertical, three-terminal memory device according to the present disclosure.

Referring now to FIG. 8I, a method 880 for fabricating the 3-D vertical, three-terminal memory device is shown. At 882, the nitride layer 414 is recessed (after using HAR etching to define the double channel holes). At 884, the SAC oxide layer 808 is deposited. At 885, the substrate is optionally cut or slit in one or more locations to expose the nitride layer 414 for a subsequent etching step. At 886, the nitride layer 414 is etched. At 888, the dielectric blocking layers 810, 812 are deposited and the SAC oxide layer 808 is etched. At 890, the conductive fill 824 is deposited. At 892, the charge trap layers 820, 822 are deposited and recessed. The gate oxide layer 826 is deposited. At 896, a P⁻ channel layer 830 is deposited and recessed at 896. Then, the N⁺ fill layer 834 is deposited at 898.

Figure 9B:
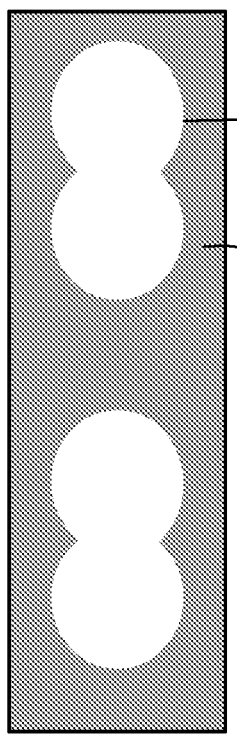
FIGS. 9A to 9C are perspective and plan views illustrating an example of creation of double channel holes.
Figure 9C:
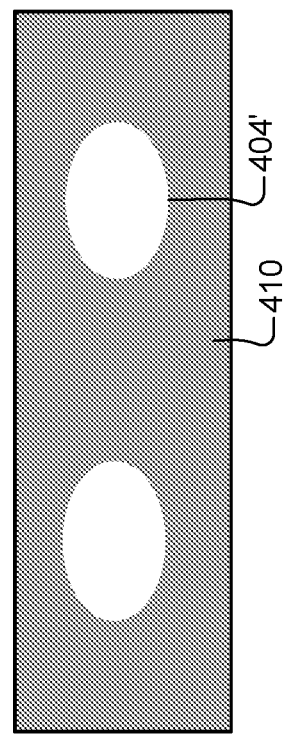
Figure 9A:
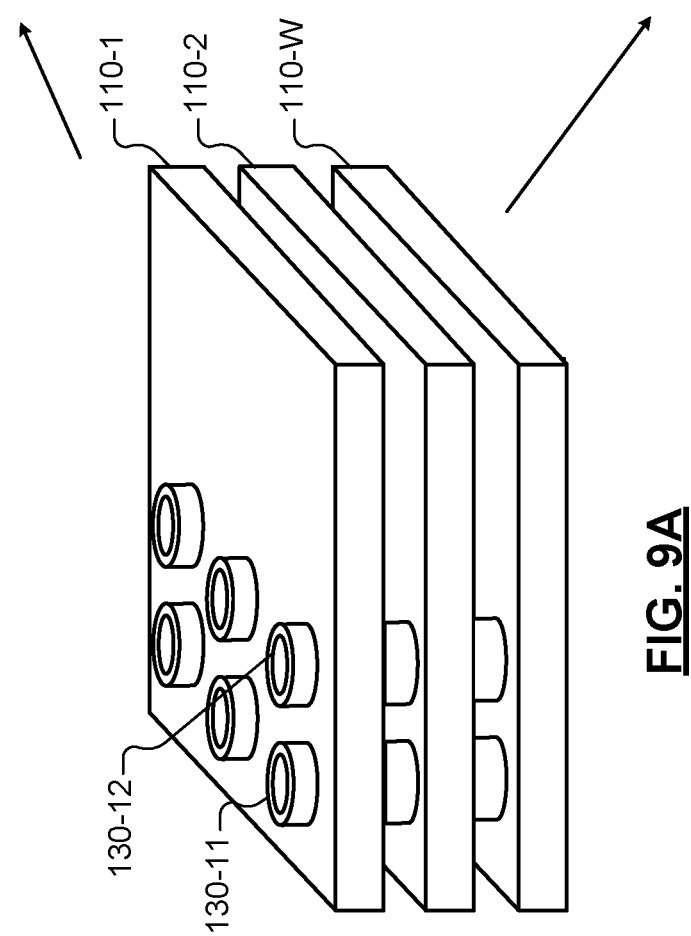

Referring now to FIGS. 9A to 9C, problems may arise when etching double channel holes with a high aspect ratio. As the etching is performed in lower word line layers, a desired shape of the double channel holes 404 in FIG. 9B is distorted. For example, the bisecting double circle shape of the double channel holes 404 in FIG. 9B is distorted into the double channel holes 404' in FIG. 9C (with an elliptical shape) in lower word line layers. The distortion can cause defects and/or reduced performance.

Figure 11A:
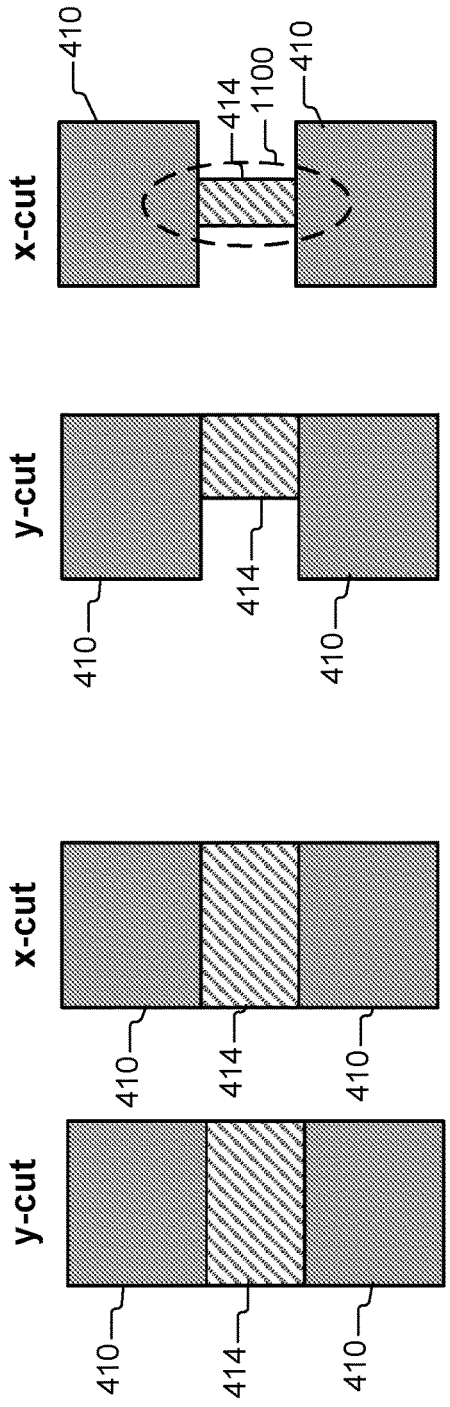
FIGS. 11A and 11B illustrate examples of an isotropic etch margin in a blocking layer through slit and a blocking layer through channel hole.
Figure 11B:
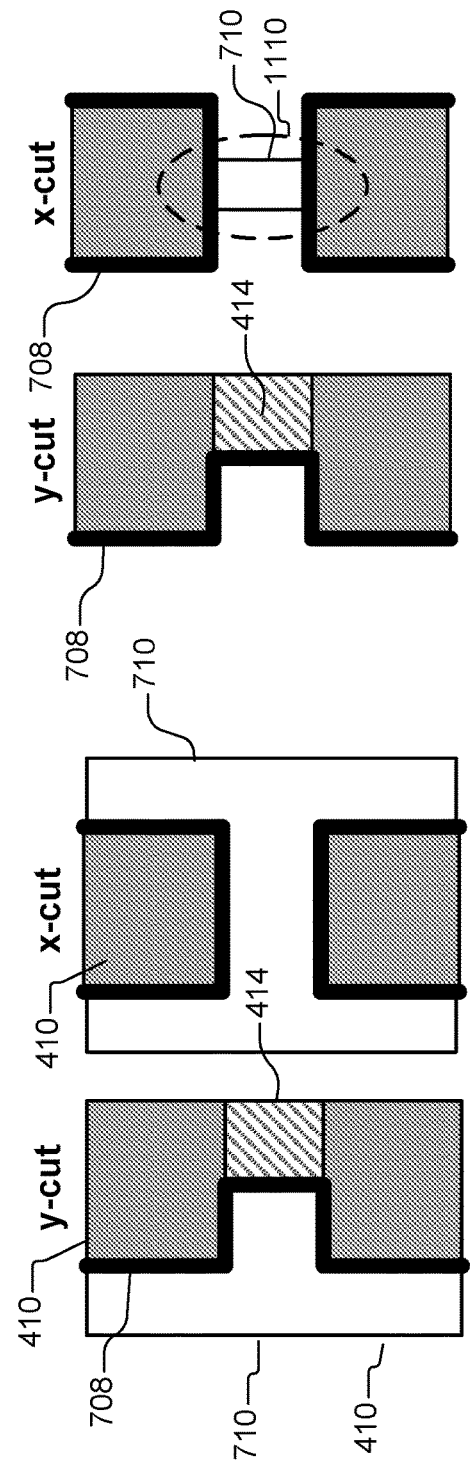

Referring now to FIGS. 10 to 11B, double channel holes can be formed to prevent distortion. In FIG. 10, round high aspect ratio (HAR) holes are initially masked and etched and then isotropic oxide etching and isotropic nitride etching is performed. In FIGS. 11A and 11B, an isotropic etch margin in a blocking layer through slit at 1100 and a blocking layer through channel hole at 1110 are shown. In some examples, isotropic atomic layer etching (ALE) or radical etching is performed to precisely control etching in these locations and maintain an etch margin.

Figure 12A:
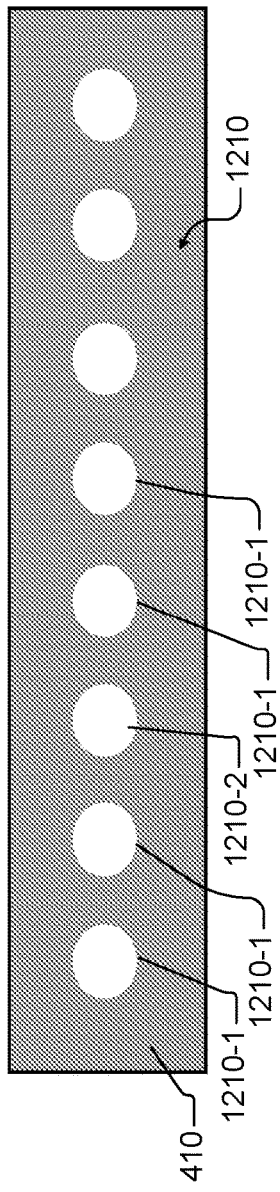
FIGS. 12A to 12D illustrate an example of isolation pillars arranged between double channel holes according to the present disclosure.
Figure 12B:
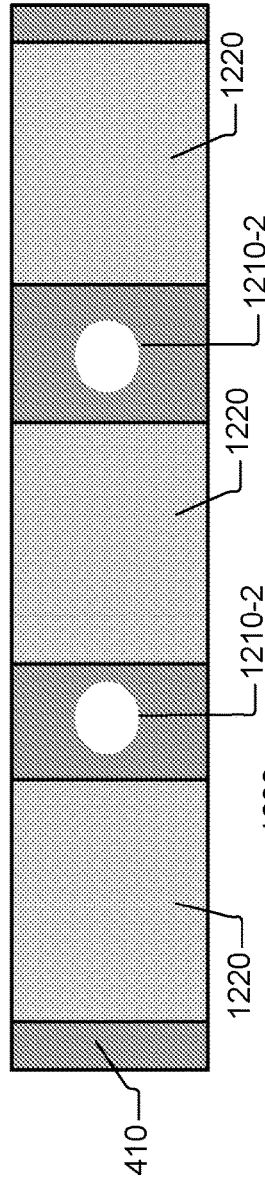
Figure 12C:
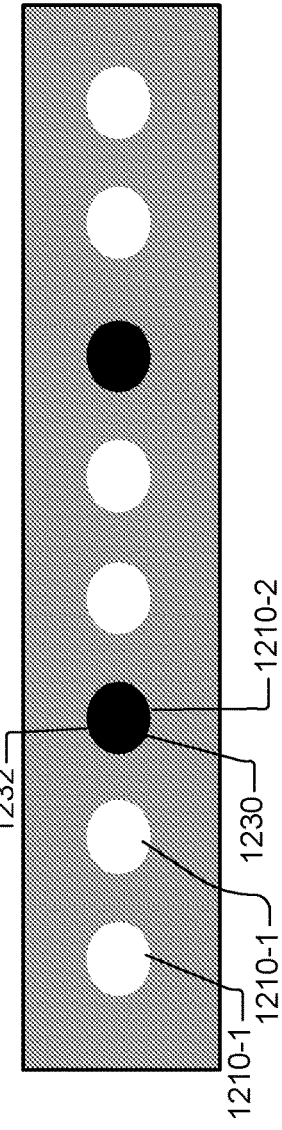
Figure 12D:
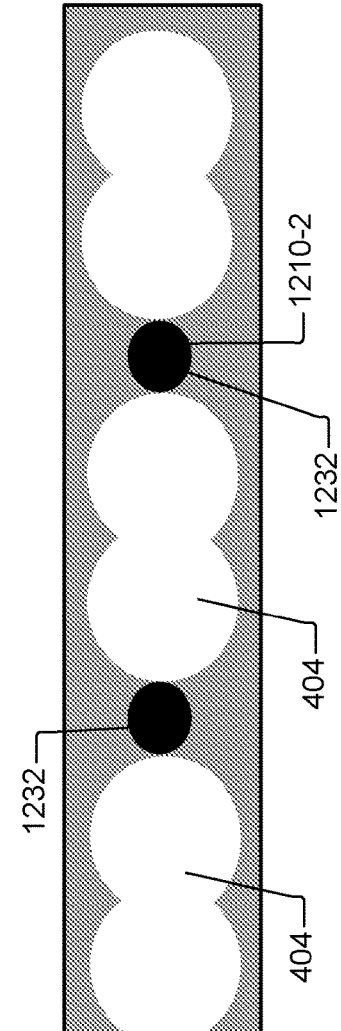

Referring now to FIGS. 12A to 12D, isolation pillars may be arranged between double channel holes. In FIG. 12A, a plurality of round holes 1210 are etched in the substrate. Adjacent holes 1210-1 are associated with double channel holes and holes 1210-2 are associated with isolation holes. The holes 1210-2 are arranged between adjacent double channel holes. In FIG. 12B, a mask layer 1220 is deposited over the holes 1210-1 to prevent deposition of dielectric into the double channel holes. The holes 1210-2 are left open. In FIG. 12C, dielectric material 1230 is deposited in the holes 1210-2 to create the isolation pillars 1232 and then the mask layer 1220 is removed. In FIG. 12D, isotropic etching of the holes 1210-1 is performed to create the double channel holes 404.

Figure 12E:
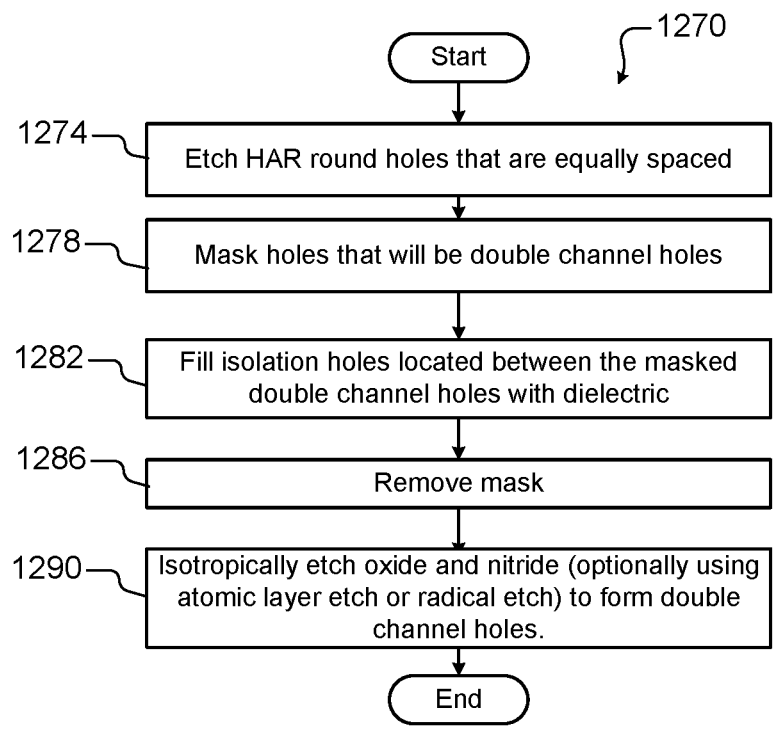
FIG. 12E is a flowchart illustrating an example of a method for fabricating isolation pillars and double channel holes according to the present disclosure.

Referring now to FIG. 12E, a method 1270 for fabricating the isolation pillars 1232 and the double channel holes 404 is shown. At 1274, HAR round holes 1210 are etched in the substrate at predetermined locations. In some examples, the HAR round holes 1210 are etched with uniform spacing. At 1278, the mask layer 1220 is deposited to cover selected ones of the holes 1210-2 corresponding to the double channel holes 404. At 1282, the isolation pillars 1232 are created by depositing dielectric into the holes 1210-2. At 1286, the mask layer 1220 is removed. At 1290, the holes 1210-1 corresponding to the double channel holes 404 are widened by isotropically etching oxide and isotropically etching nitride using ALE or radical etching.

Referring now to FIGS. 13A to 13D, fabrication of a 3-D NOR with a floating gate is shown. Instead of using a substrate including alternating ONON layers, the substrate includes alternating oxide and polysilicon layers (or OPOP). In FIG. 13A, polysilicon layers 1310 are shown with a plurality of holes 1312. Orientations of x-cut and y-cut cross-sections for side views of FIGS. 14A to 14D are shown. Adjacent holes 1312-1 correspond to double channel holes and holes 1312-2 correspond to isolation pillars 1316 that are filled with dielectric 1314. As described above, a mask layer is used to block the holes 1312-1 corresponding to the double channel holes. Dielectric is deposited in the holes 1312-2 corresponding to the isolation pillars 1316. Then in FIG. 13B, the holes 1312-1 are etched using an isotropic oxide etch and an isotropic polysilicon etch to create double channel holes 1317 having a peanut-shaped cross-section.

In FIG. 13C, an inter polysilicon dielectric (IPD) layer 1330 is deposited on side surfaces of the double channel holes 1317. The IPD layer 1330 in the double channel holes 1317 and also has a peanut-shaped cross-section. In FIG. 13D, a floating gate 1332 is deposited and etched back. The floating gate 1332 has an "8"-shaped cross-section and defines first and second cavities extending vertically. A gate oxide layer 1340 is deposited and partially fills the first and second cavities. A channel polysilicon layer 1350 is deposited into the first and second cavities to fill the first and second cavities.

In FIG. 14A, the substrate is shown after etching of the HAR round holes in the oxide layers 1352 and the polysilicon layers 1310 and deposition of the isolation pillars 1316 in the holes 1312-2. In FIG. 14B, etching is performed to recess the polysilicon layers 1310. In FIG. 14C, deposition of the IPD layer 1330 is shown. At 14C, the floating gate 1332 is deposited and etched back. The gate oxide layer 1340 is deposited. The channel polysilicon layer 1350 is deposited.

Figure 15:
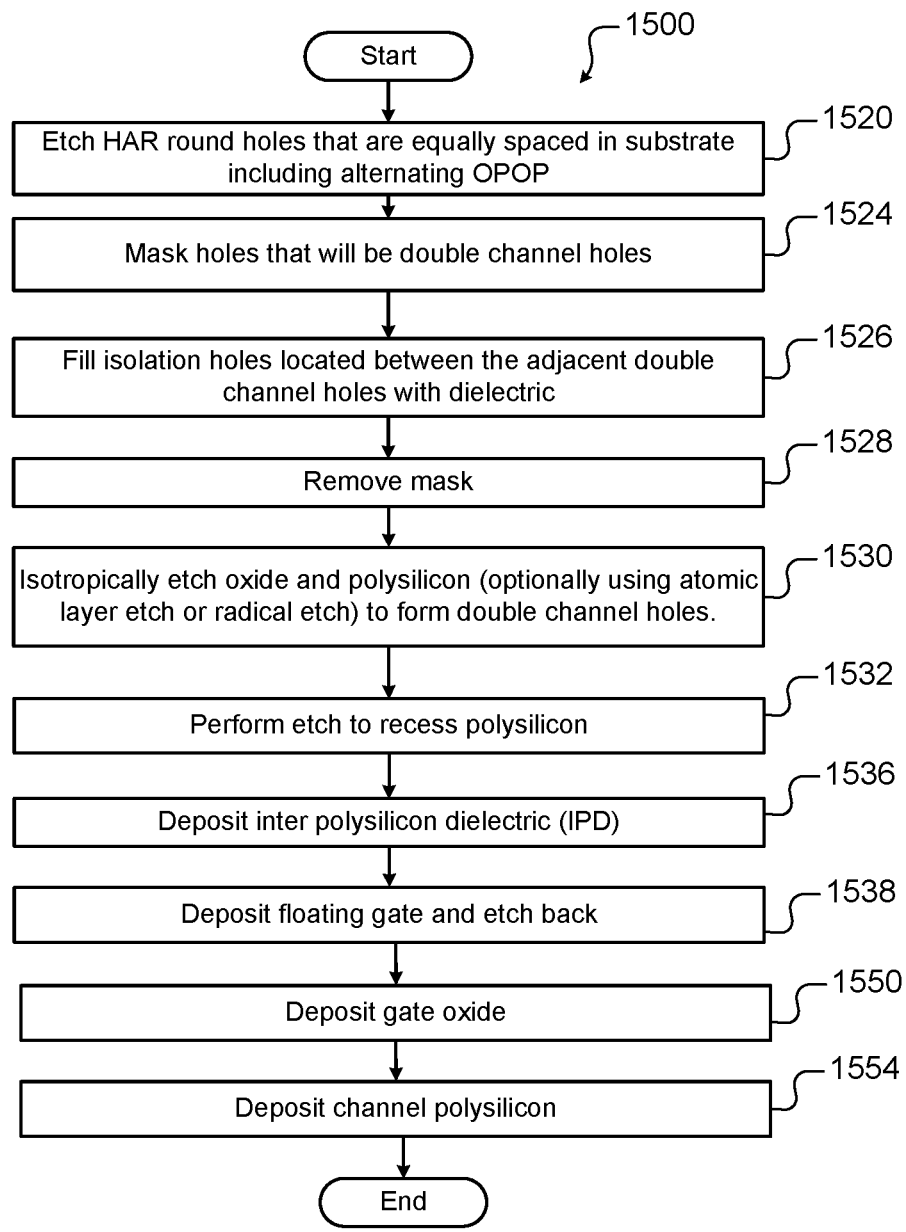
FIG. 15 is a flowchart of an example of a method for fabricating a 3-D NOR with a floating gate according to the present disclosure.

Referring now to FIG. 15, a method 1500 for fabricating a 3-D NOR with a floating gate is shown. At 1520, the HAR round holes are etched into the substrate that includes the oxide layers 1352 and the polysilicon layers 1310 that alternate. At 1524, the holes 1312-1 corresponding to double channel holes are masked. At 1526, the holes 1312-2 corresponding to isolation holes are filled with the dielectric 1314. At 1528, the mask layer is removed. At 1530, the oxide layers 1352 and the polysilicon layers 1310 are isotropically etched to form the double channel holes 1317. At 1532, etching is performed to recess the polysilicon layers 1310 relative to the oxide layers 1352. At 1536, an inter polysilicon dielectric (IPD) layer 1330 is deposited. At 1538, the floating gate 1332 is deposited and etched back. At 1548, the gate oxide layer 1340 is deposited. At 1554, the channel polysilicon layer 1350 is deposited.

As can be appreciated, etching of the oxide as described above is performed selectively. That is, the etching of the oxide is performed using a process that etches the oxide more than other exposed materials such as nitride, polysilicon, etc. In some examples, the selectivity of the oxide etching process is greater than 4:1, 10:1, 50:1 or 100:1. Etching of the nitride as described above is performed selectively. That is, the etching of the nitride is performed using a process that etches the nitride more than other exposed materials such as oxide, polysilicon, etc. In some examples, the selectivity of the nitride etching process is greater than 4:1, 10:1, 50:1 or 100:1. Likewise, etching of the polysilicon as described above is performed selectively. That is, the etching of the polysilicon is performed using a process that etches the polysilicon more than other exposed materials such as nitride, polysilicon, etc. In some examples, the selectivity of the polysilicon etching process is greater than 4:1, 10:1, 50:1 or 100:1. There are a variety of systems and methods for selective etching of oxide, nitride and polysilicon that can be found in commonly assigned patents and patent applications.

Examples of radical etching are shown and described in commonly-assigned U.S. patent application Ser. No. 15/271,381, filed on Sep. 21, 2016 and entitled "Systems and Methods for Ultrahigh Selective Nitride Etch"; commonly-assigned U.S. patent application Ser. No. 15/426,241, filed on Feb. 7, 2017 and entitled "Systems and Methods for Selectively Etching Film"; commonly-assigned U.S. patent application Ser. No. 15/845,206, filed on Dec. 18, 2017 and entitled "Systems and Methods for Metastable Activated Radical Selective Strip and Etch Using Dual Plenum Showerhead", and commonly-assigned U.S. Pat. No. 9,837,286, filed on Feb. 3, 2016 and entitled "Systems and Methods for Selectively Etching Tungsten in a Downstream Reactor", which are hereby incorporated by reference in their entirety.

An example of high aspect ratio etching of dielectric materials may be found in commonly-assigned PCT Patent No. WO2019178030A1 filed on Mar. 12, 2019 and entitled "Plasma Etching Chemistries of High Aspect Ratio Features in Dielectrics", which is hereby incorporated by reference in its entirety.

In some examples, the deposition of materials such as oxide and/or nitride is performed using a conformal process such as atomic layer deposition (ALD). Examples of conformal oxide and nitride deposition can be found in commonly-assigned U.S. Pat. No. 9,502,238 filed on Apr. 3, 2015 and entitled "Deposition of Conformal Films by Atomic Layer Deposition and Atomic Layer Etch", and commonly-assigned U.S. Pat. No. 8,728,955 filed on Mar. 1, 2012 and entitled "Method Of Plasma Activated Deposition Of A Conformal Film On A Substrate Surface", which are hereby incorporated by reference in their entirety.

Examples of tungsten deposition can be found in commonly-assigned PCT Patent No. WO19036292 A1 filed on Aug. 10, 2018 and entitled "Metal Fill Process for Three-Dimensional Vertical NAND Wordline", commonly-assigned U.S. Pat. No. 9,082,826 filed on May 22, 2014 and entitled "Methods and Apparatuses for Void-Free Tungsten Fill in Three-Dimensional Semiconductor Features", and commonly-assigned U.S. Pat. No. 10,214,807 filed on Jun. 2, 2016 and entitled "Atomic Layer Deposition of Tungsten for Enhanced Fill and Reduced Substrate Attack", which is hereby incorporated by reference in its entirety.

In addition to selective etching, systems and methods for selective deposition of tungsten, oxide, nitride and polysilicon can be used. Selective deposition of these materials relates to deposition of a material on some of the exposed materials of the substrate more than on other exposed materials of the substrate. In some examples, the selectivity of the deposition process for one deposited material on one selected material of the substrate is greater than 4:1, 10:1, 50:1 or 100:1 relative to other exposed materials of the substrate. Examples of selective tungsten deposition can be found in commonly-assigned U.S. Pat. No. 8,778,797 filed on Sep. 23, 2011 and entitled "Systems And Methods For Selective Tungsten Deposition In Vias". Examples of selective oxide or nitride deposition can be found in commonly-assigned U.S. Pat. No. 10,199,212 filed on May 9, 2018 and entitled "Selective Growth of Silicon Oxide or Silicon Nitride on Silicon Surfaces in the Presence of Silicon Oxide", U.S. Patent Publ. No. 20190043876A1 filed on Aug. 1, 2018 and entitled "Selective Deposition of SiN on Horizontal Surfaces", which are hereby incorporated by reference in their entirety.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A three-dimensional (3D) memory structure for memory cells, comprising:
   a plurality of oxide layers;
   a plurality of word line layers,
   wherein the plurality of oxide layers and the plurality of word line layers are alternately stacked in a first direction; and
   a plurality of double channel holes extending through the plurality of oxide layers and the plurality of word line layers in the first direction,
   wherein the plurality of double channel holes have a peanut-shaped cross-section in a second direction that is transverse to the first direction.

2. The 3D memory structure of claim 1, wherein the plurality of word line layers are recessed relative to the plurality of oxide layers in the plurality of double channel holes.

3. The 3D memory structure of claim 1, wherein the memory cells further comprise three terminal NOR memory cells.

4. The 3D memory structure of claim 1, further comprising a multilayer stack deposited on an inner surface of the plurality of double channel holes and defining a first cavity extending in the first direction.

5. The 3D memory structure of claim 4, wherein the first cavity has a peanut-shaped cross-section in the second direction.

6. The 3D memory structure of claim 4, wherein the multilayer stack includes a blocking oxide layer, a charge trap layer and a gate oxide layer.

7. The 3D memory structure of claim 4, wherein the multilayer stack includes a blocking oxide layer, a ferroelectric layer and a gate oxide layer.

8. The 3D memory structure of claim 4, wherein the multilayer stack includes a blocking oxide layer, a spin-orbit torque (SOT) layer and a gate oxide layer.

9. The 3D memory structure of claim 4, further comprising a polysilicon layer arranged on an inner surface of the first cavity.

10. The 3D memory structure of claim 9, wherein the polysilicon layer defines a second cavity and a third cavity extending in the first direction.

11. The 3D memory structure of claim 10, wherein the second cavity and the third cavity have an elliptical cross-section in the second direction.

12. The 3D memory structure of claim 9, wherein the polysilicon layer includes a P⁻ layer.

13. The 3D memory structure of claim 9, wherein the polysilicon layer has an "8"-shaped cross-section in the second direction.

14. The 3D memory structure of claim 10, further comprising an N+ layer arranged in the second cavity and the third cavity.

15. A method for fabricating a three-dimensional (3D) memory structure for memory cells, comprising:
providing a substrate including a plurality of oxide layers and a plurality of nitride layers, wherein the plurality of oxide layers and the plurality of nitride layers are alternately stacked in a first direction; and
etching a plurality of double channel holes in the plurality of oxide layers and the plurality of nitride layers, wherein the plurality of double channel holes extend in the first direction,
wherein the plurality of double channel holes have a peanut-shaped cross-section in a second direction that is transverse to the first direction.

16. The method of claim 15, wherein the memory cells comprise three terminal NOR memory cells.

17. The method of claim 15, further comprising partially etching back the plurality of nitride layers relative to the plurality of oxide layers in the plurality of double channel holes.

18. The method of claim 17, further comprising depositing a multilayer stack on an inner surface of the plurality of double channel holes, wherein the multilayer stack defines a first cavity extending in the first direction.

19. The method of claim 17, wherein the first cavity has a peanut-shaped cross-section in the second direction.

20. The method of claim 18, wherein depositing the multilayer stack includes depositing a blocking oxide layer, a charge trap layer and a gate oxide layer.

21. The method of claim 18, wherein depositing the multilayer stack includes depositing a blocking oxide layer, a ferroelectric layer and a gate oxide layer.

22. The method of claim 18, wherein depositing the multilayer stack includes depositing a blocking oxide layer, a spin-orbit torque (SOT) layer and a gate oxide layer.

23. The method of claim 18, further comprising depositing a polysilicon layer on an inner surface of the first cavity in the plurality of double channel holes.

24. The method of claim 23, wherein the polysilicon layer defines a second cavity and a third cavity extending in the first direction.

25. The method of claim 24, wherein the second cavity and the third cavity have an elliptical cross-section in the second direction.

26. The method of claim 23, wherein the polysilicon layer includes a P− layer.

27. The method of claim 23, wherein the polysilicon layer has an "8"-shaped cross-section in the second direction.

28. The method of claim 24, further comprising depositing N+ layer in the second cavity and the third cavity.

29. The method of claim 28, further comprising cutting the substrate to at least partially expose portions of the plurality of nitride layers.

30. The method of claim 29, further comprising etching the plurality of nitride layers.

31. The method of claim 30, further comprising depositing conductive fill in etched locations of the plurality of nitride layers.

* * * * *